United States Patent
Shiota

(10) Patent No.: US 8,354,349 B2
(45) Date of Patent: Jan. 15, 2013

(54) SEMICONDUCTOR DEVICE HAVING SEALING FILM AND MANUFACTURING METHOD THEREOF

(75) Inventor: Junji Shiota, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 403 days.

(21) Appl. No.: 12/727,406

(22) Filed: Mar. 19, 2010

(65) Prior Publication Data

US 2010/0173455 A1 Jul. 8, 2010

Related U.S. Application Data

(62) Division of application No. 11/903,677, filed on Sep. 24, 2007, now abandoned.

(30) Foreign Application Priority Data

Sep. 26, 2006 (JP) ................................. 2006-260349

(51) Int. Cl.
*H01L 21/31* (2006.01)
*H01L 21/469* (2006.01)

(52) U.S. Cl. ........ 438/758; 438/460; 438/113; 438/782; 438/106; 257/E21.007; 257/E21.082; 257/E21.237; 257/E21.278; 257/E21.293; 257/E21.267; 257/E21.304; 257/E21.324; 257/E21.499; 257/E21.502; 257/E21.503

(58) Field of Classification Search .................. 438/758, 438/760, 781, 782, 460, 113, 122, 124, 126, 438/106, 723, 724, 725, 780; 257/E21.007, 257/E21.082, E21.237, E21.278, E21.293, 257/E21.267, E21.304, E21.324, E21.499, 257/E21.502, E21.503

See application file for complete search history.

(56) References Cited

U.S. PATENT DOCUMENTS

| | | | |
|---|---|---|---|
| 6,203,891 | B1 | 3/2001 | Noddin |
| 6,544,638 | B2 | 4/2003 | Fischer et al. |
| 7,122,897 | B2 | 10/2006 | Aiba et al. |
| 2004/0099950 | A1 | 5/2004 | Ohsumi |
| 2005/0218451 | A1 | 10/2005 | Jobetto |
| 2005/0218473 | A1 | 10/2005 | Wakisaka |

(Continued)

FOREIGN PATENT DOCUMENTS

JP 2000-22052 A 1/2000

(Continued)

OTHER PUBLICATIONS

Japanese Office Action dated Aug. 5, 2008, and English translation thereof, issued in a counterpart Japanese Application.

*Primary Examiner* — David Nhu

(74) *Attorney, Agent, or Firm* — Holtz, Holtz, Goodman & Chick, PC

(57) ABSTRACT

A semiconductor device includes a plurality of wiring lines which are provided on an upper side of a semiconductor substrate and which have connection pad portions, and columnar electrodes are provided on the connection pad portions of the wiring lines. A first sealing film is provided around the columnar electrodes on the upper side of the semiconductor substrate and on the wiring lines. A second sealing film is provided on the first sealing film. The first sealing film is made of a resin in which fillers are not mixed, and the second sealing film is made of a material in which fillers are mixed in a resin.

13 Claims, 35 Drawing Sheets

| U.S. PATENT DOCUMENTS | | | FOREIGN PATENT DOCUMENTS | | |
|---|---|---|---|---|---|
| 2006/0125072 A1 | 6/2006 | Mihara | JP | 2005-286146 A | 10/2005 |
| 2006/0180908 A1 | 8/2006 | Yano et al. | JP | 2005-327816 A | 11/2005 |
| 2007/0249093 A1 | 10/2007 | Aiba et al. | | | |
| 2008/0073785 A1* | 3/2008 | Shiota ............................ 257/738 | * cited by examiner | | |

SEMICONDUCTOR DEVICE HAVING SEALING FILM AND MANUFACTURING METHOD THEREOF

CROSS-REFERENCE TO RELATED APPLICATIONS

This is a Divisional Application of U.S. application Ser. No. 11/903,677 filed Sep. 24, 2007, now abandoned, which is based upon and claims the benefit of priority from Japanese Patent Application No. 2006-260349, filed Sep. 26, 2006, the entire contents of both of which are incorporated herein by reference.

BACKGROUND OF THE INVENTION

1. Field of the Invention

This invention relates to a semiconductor device having a sealing film and a manufacturing method thereof.

2. Description of the Related Art

There has been known a semiconductor device called a chip size package (CSP) described in, for example, Jpn. Pat. Appln. KOKAI Publication No. 2000-22052. The semiconductor device described in this Jpn. Pat. Appln. KOKAI Publication has a structure in which wiring lines are provided on a semiconductor substrate, and columnar electrodes are provided on the upper surface of connection pad portions of the wiring lines, and then a sealing film covers the semiconductor substrate except for these columnar electrodes. In this case, in order to reduce stress caused by the difference between the thermal expansion coefficients of the semiconductor substrate and the sealing film, the sealing film has a three-layer structure which includes, starting from the side of the semiconductor substrate, a lower sealing film or layer having a large amount of silica particles mixed in epoxy resin, an intermediate sealing film or layer having a small amount of silica particles mixed in epoxy resin, and an upper sealing film or layer made of epoxy resin alone.

In a general sealing film forming method that is known, a sealing film formation film made of liquid epoxy resin with or without silica particles therein is formed on the semiconductor substrate by screen printing, and the liquid epoxy resin in the formation film is heated and hardened to form a sealing film.

On the other hand, if the screen printing is carried out in the atmosphere, the liquid resin is pressed on a screen by a squeegee, so that air is caught into the formation film as air bubbles. If such a film is hardened as it is, its strength and moisture resistant properties deteriorate because the air bubbles are scattered in the sealing film. Therefore, it is possible to carry out vacuum deaeration in a vacuum chamber after the screen printing, in order to remove the air bubbles scattered in the formation film.

However, in the conventional semiconductor device described above, the lower sealing layer of the sealing film is formed by the material having a large amount of silica particles mixed in the epoxy resin, so that when the diameter of the silica particle is greater than the distance between the wiring lines, the silica particle may not be contained between the wiring lines and may be placed to extend over the adjacent wiring lines. In such a case, when the formation film is formed by the screen printing, there is a problem that air tends to remain as air bubbles in a gap under the silica particles placed to extend over the adjacent wiring lines, and the air bubbles are not easily removed by the vacuum deaeration and remain as they are between the wiring lines.

BRIEF SUMMARY OF THE INVENTION

This invention is directed to provide a semiconductor device and a manufacturing method thereof which can prevent air bubbles resulting from fillers from remaining between wiring lines even when a sealing film is formed by a resin containing the fillers such as silica particles.

According to a first aspect of the invention there is provided a semiconductor device comprising: a semiconductor substrate; a plurality of wiring lines which are provided on an upper side of the semiconductor substrate and which have connection pad portions; columnar electrodes provided on the connection pad portions of the wiring lines; a first sealing film provided around the columnar electrodes on the upper side of the semiconductor substrate and on the wiring lines; and a second sealing film provided on the first sealing film, wherein the first sealing film is made of a resin in which fillers are not mixed, and the second sealing film is made of a material in which fillers are mixed in a resin.

Furthermore, according to a second aspect of the invention there is provided a semiconductor device manufacturing method comprising:

forming a plurality of wiring lines on an upper side of a semiconductor wafer, and respectively forming columnar electrodes on connection pad portions of the wiring lines;

forming a first sealing film formation film made of a liquid resin on an upper side of the wafer in the atmosphere to fill a gap between the wiring lines;

carrying out vacuum deaeration for the first sealing film formation film;

forming a second sealing film formation film made of a liquid resin containing fillers on the first sealing film formation film in the atmosphere;

carrying out the vacuum deaeration for the second sealing film formation film;

hardening the first and second sealing film formation films by a thermal treatment to form first and second sealing films; and cutting the semiconductor wafer and the first and second sealing films to obtain a plurality of semiconductor devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
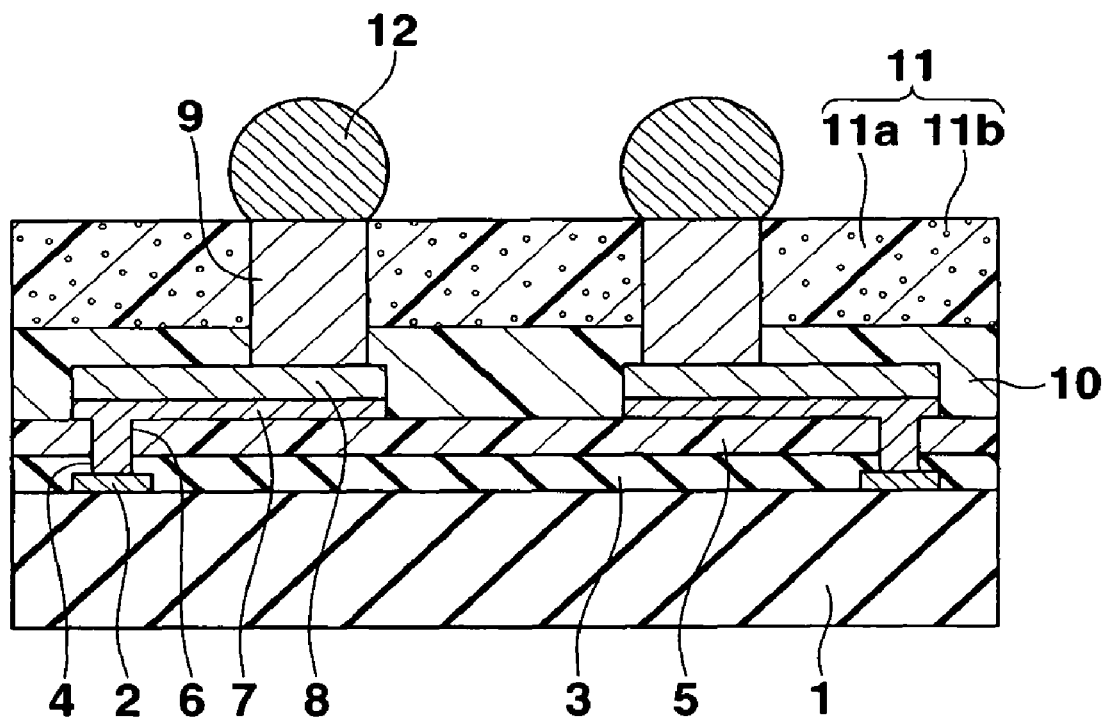
FIG. 1 is a sectional view of a semiconductor device as one embodiment of this invention.

FIG. 1 is a sectional view of a semiconductor device as one embodiment of this invention. This semiconductor device comprises a silicon substrate (semiconductor substrate) 1. An integrated circuit (not shown) with a predetermined function is provided on the upper surface of the silicon substrate 1, and a plurality of connection pads 2 made of, for example, an aluminum-based metal are provided in the peripheral part of the upper surface so that these connection pads are electrically connected to the integrated circuit.

An insulating film 3 made of, for example, an organic material or an inorganic material such as silicon oxide is provided on the connection pads 2 except for their centers and on the upper surface of the silicon substrate 1. The centers of the connection pads 2 are exposed via openings 4 formed in the insulating film 3. A protective film 5 made of polyimide-based resin is provided on the upper surface of the insulating film 3. The protective film 5 is not mixed with fillers such as silica particles. Openings 6 are provided in parts of the protective film 5 corresponding to the openings 4 of the insulating film 3.

A foundation metal layer 7 made of, for example, copper is provided on the upper surface of the protective film 5. A wiring line 8 made of copper is provided on the entire upper surface of the foundation metal layer 7. One end of the wiring line 8 including the foundation metal layer 7 is electrically connected to the connection pad 2 via the openings 4 and 6 of the insulating film 3 and the protective film 5. A columnar electrode 9 made of copper is provided on the upper surface of the connection pad portion of each of the wiring lines 8. The columnar electrode 9 is not exclusively limited to but is typically about 30 to 120 μm in height.

First and second sealing films 10 and 11 are provided in this order on the upper surfaces of the wiring line 8 and the protective film 5 so that these films are located around the columnar electrodes 9. The first sealing film 10 is made of a synthetic resin such as epoxy resin (no fillers mixed therein) in which any additional material as fillers is mixed, completely covers the wiring line 8, and is provided so that its upper surface may be flat. The second sealing film 11 is made of a material in which fillers 11b such as silica particles are mixed or distributed in a resin 11a such as epoxy resin. The second sealing film 11 is provided so that its upper surface may be flush with the upper surfaces of the columnar electrodes 9. A solder ball 12 is provided on the upper surface of the columnar electrode 9.

In this specification, the filler indicates a mixture for bringing the thermal expansion coefficient of the sealing film formed of the resin closer to the thermal expansion coefficient of the semiconductor substrate than when no fillers are present.

Figure 2:
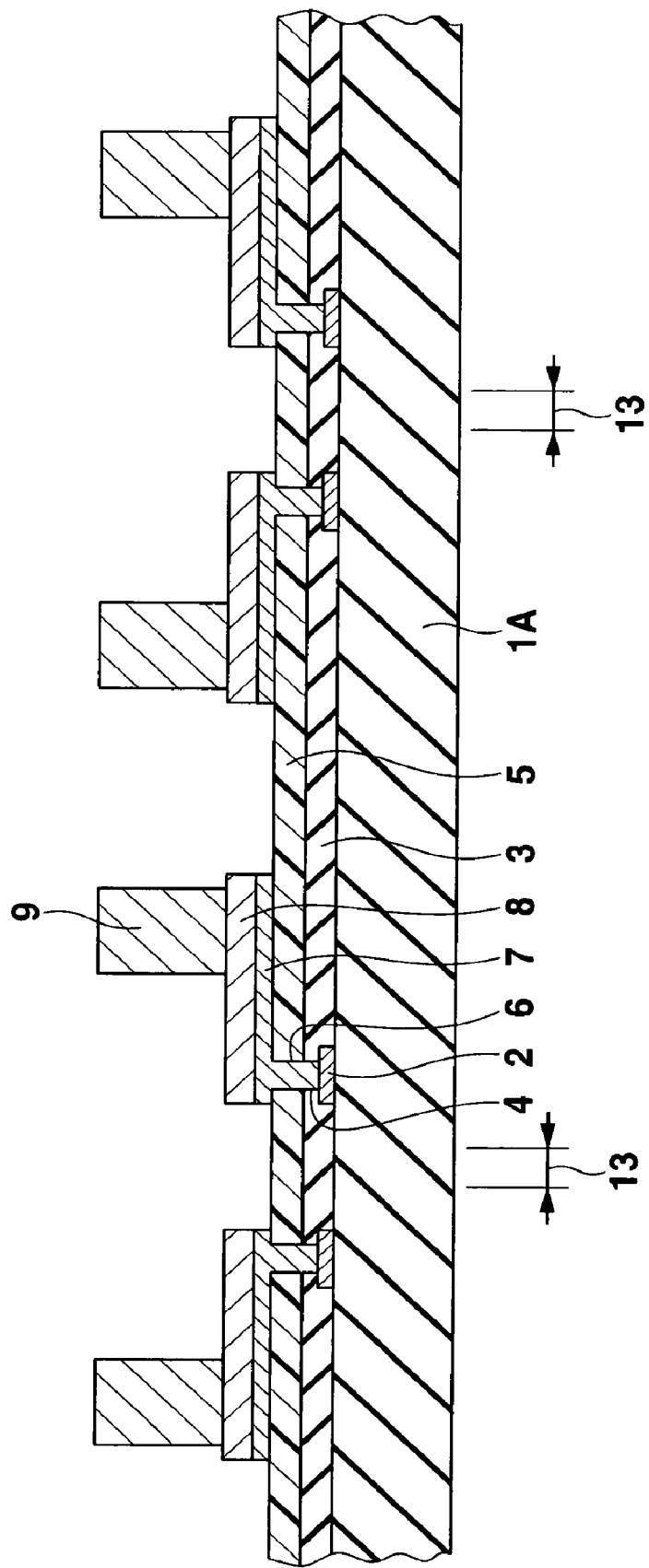
FIG. 2 is a sectional view of initially prepared components for the manufacture of the semiconductor device shown in FIG. 1.

Next, one example of a method of manufacturing this semiconductor device will be described. First, as shown in FIG. 2, an assembly is prepared wherein: the connection pads 2 made of the aluminum-based metal are provided on the upper surface of the silicon substrate (hereinafter referred to as a wafer 1A) in a wafer state; the insulating film 3 made of, for example, silicon oxide, and the protective film 5 made of, for example, polyimide-based resin are provided in a region of the upper surfaces of the wafer 1A and the connection pads 2 except for the centers of the connection pads 2; the foundation metal layers 7 made of, for example, copper is provided on the upper surface of the protective film 5 including the upper surfaces of the connection pads 2 exposed via the openings 4 and 6 provided in the insulating film 3 and the protective film 5; the wiring lines 8 made of copper are respectively provided on the entire upper surface of the foundation metal layers 7; and the columnar electrodes 9 made of copper are provided on the upper surfaces of the connection pad portions of the wiring line 8. In FIG. 2, regions indicated by a numeral 13 correspond to dicing lines.

Figure 3:
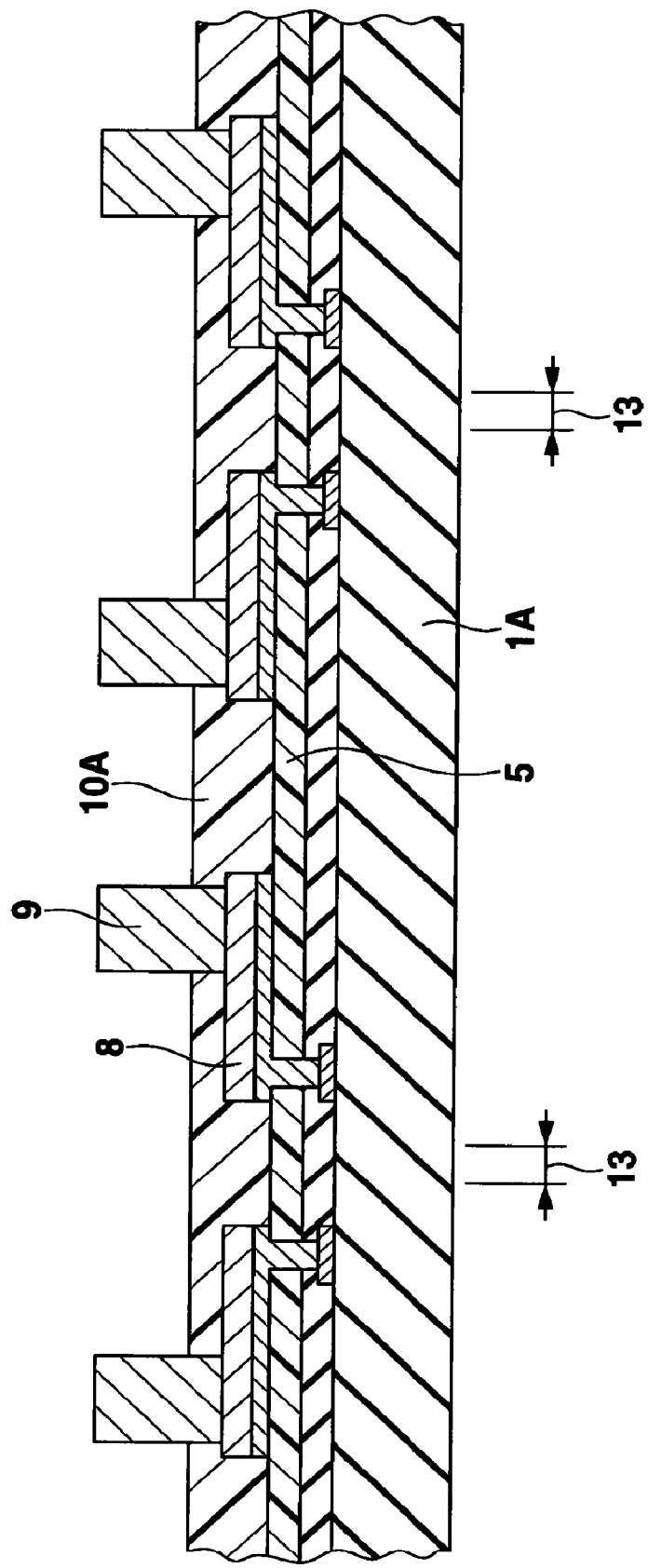
FIG. 3 is a sectional view for a step following FIG. 2.
Figure 4:
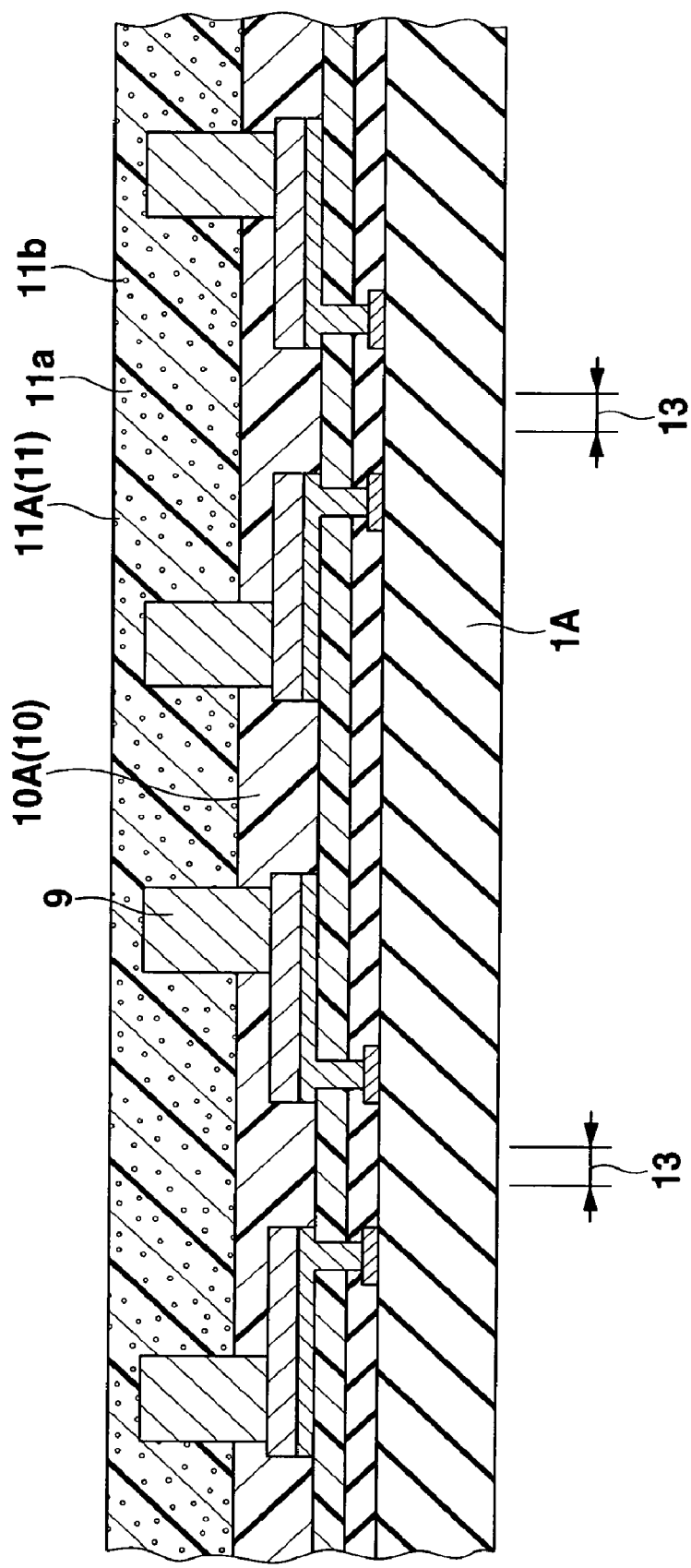
FIG. 4 is a sectional view for a step following FIG. 3.

Next, as shown in FIG. 3, a first sealing film formation film 10A made of, for example, liquid epoxy-based resin in which any additional material as fillers is not mixed is formed by spin coating described later around the columnar electrodes 9 on the upper surface of the protective film 5 and the wiring lines 8 to cover the wiring lines 8, so that a gap between the wiring lines 8 is completely filled with the synthetic resin film 10A, and so that the upper surface of the first sealing film formation film 10A is substantially flat. In this case, the first formation film 10A has only to fill the gap between the wiring lines 8 and have a flat upper surface, and the thickness of this film on the protective film 5 is preferably about a few or several µm. As the spin coating is carried out in the atmosphere as described later, air is caught into the first sealing film formation film 10A as air bubbles. Therefore, the air bubbles caught in the first formation film 10A are then removed by vacuum deaeration described later. Next, as shown in FIG. 4, a second sealing film formation film 11A made of the resin 11a such as liquid epoxy resin containing the fillers 11b such as silica particles at 60 to 95 weight percent is formed on the upper surface of the first formation film 10A and the columnar electrodes 9 by screen printing described later so that the upper surface of the second formation film 11A is slightly higher than the upper surface of the columnar electrode 9. Therefore, in this condition, the upper surfaces of the columnar electrodes 9 are completely covered with the second formation film 11A.

In this case, the gap or space between the wiring lines 8 is completely filled by the first formation film 10A. Thus, even when the diameter of the filler 11b made of, for example, the silica particle is larger than the distance between the wiring lines 8, and the filler 11b is placed to extend over the adjacent wiring lines 8, no space is formed between the adjacent wiring lines 8 under the placed filler 11b, thus ensuring that the production of air bubbles due to this space can be prevented. Thus, even if the second sealing film formation film 11A is formed by the resin 11a containing the fillers 11b such as the silica particles, air bubbles due to the fillers 11b can be prevented from remaining between the wiring lines 8.

Since the above-mentioned screen printing is carried out in the atmosphere as described later, air is caught into the second formation film 11A as air bubbles. Therefore, the air bubbles caught in the second formation film 11A are then removed by the vacuum deaeration described later. Then, the first and second formation films 10A and 11A are hardened by a thermal treatment to form the first and second sealing films 10 and 11.

Figure 5:
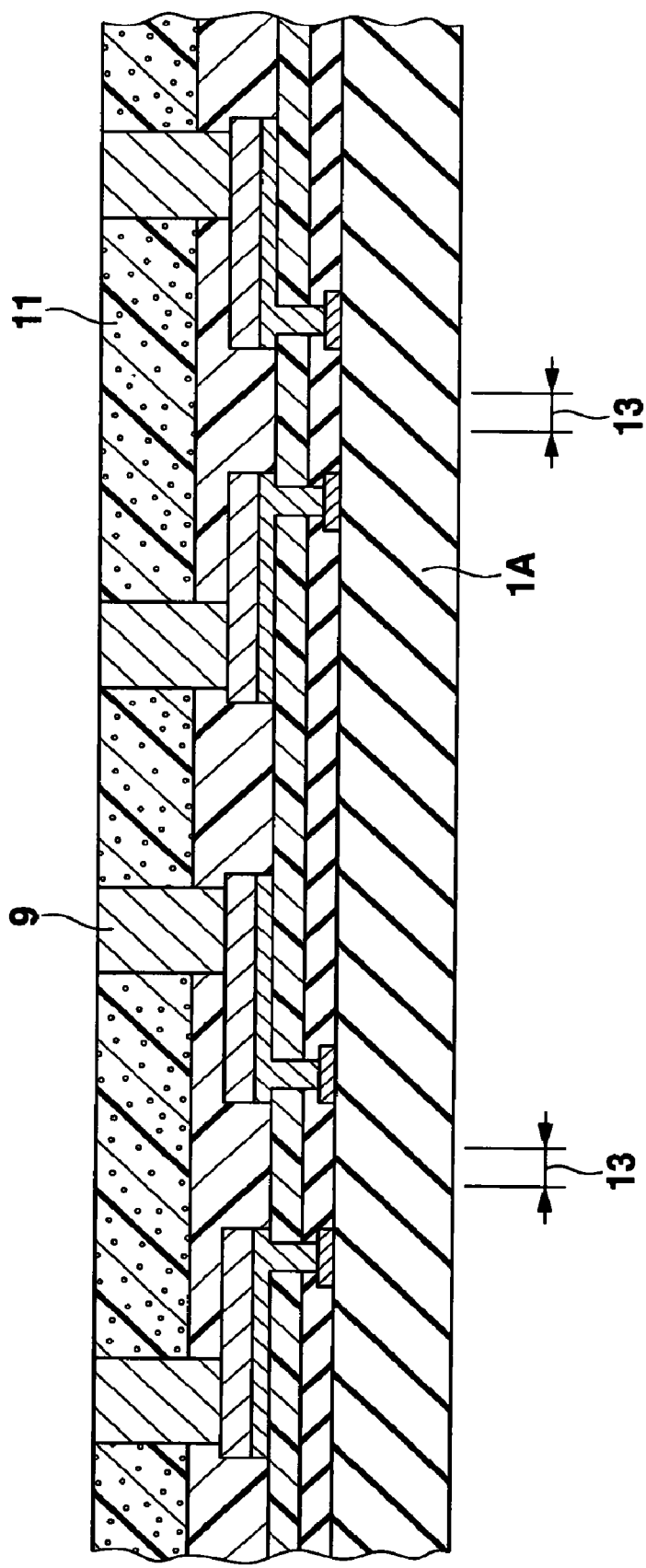
FIG. 5 is a sectional view for a step following FIG. 4.
Figure 6:
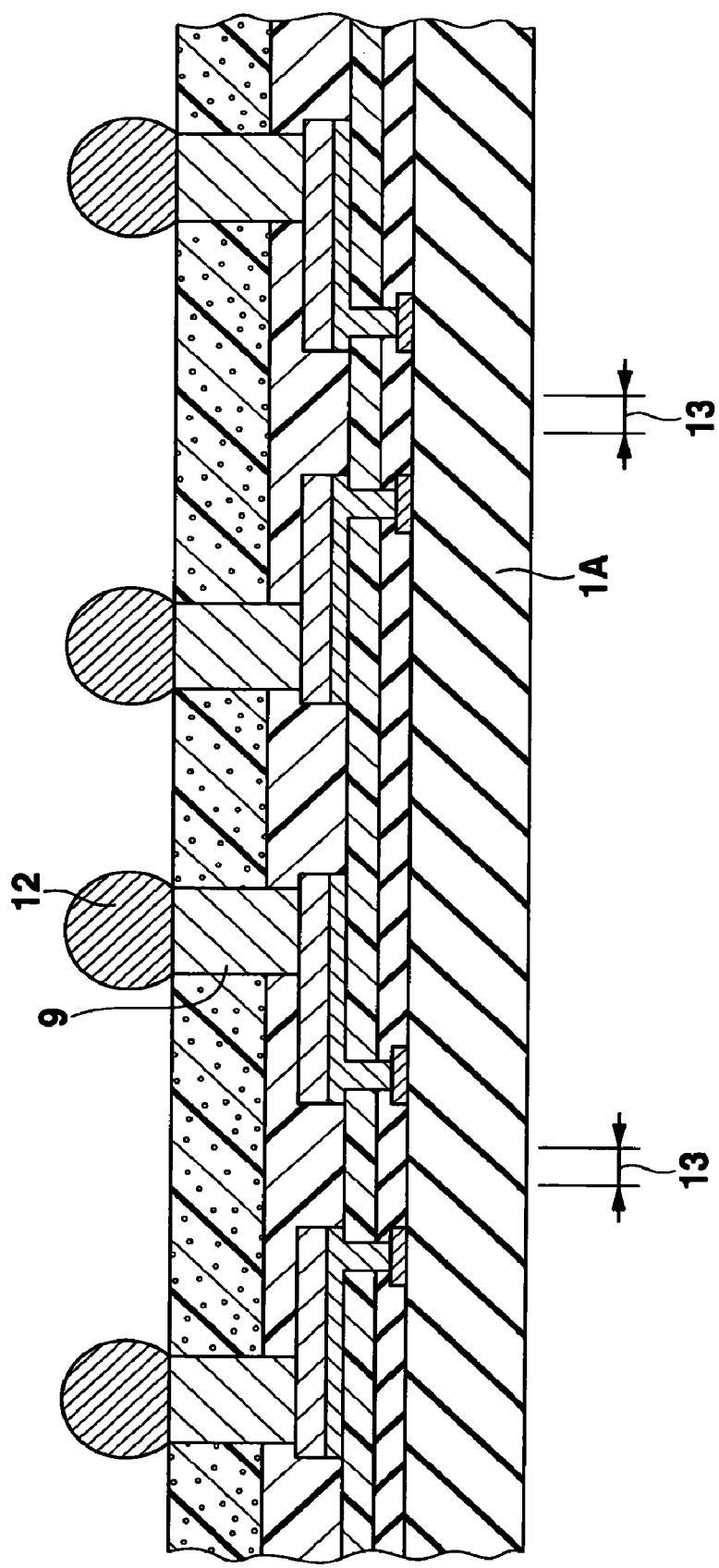
FIG. 6 is a sectional view for a step following FIG. 5.
Figure 7:
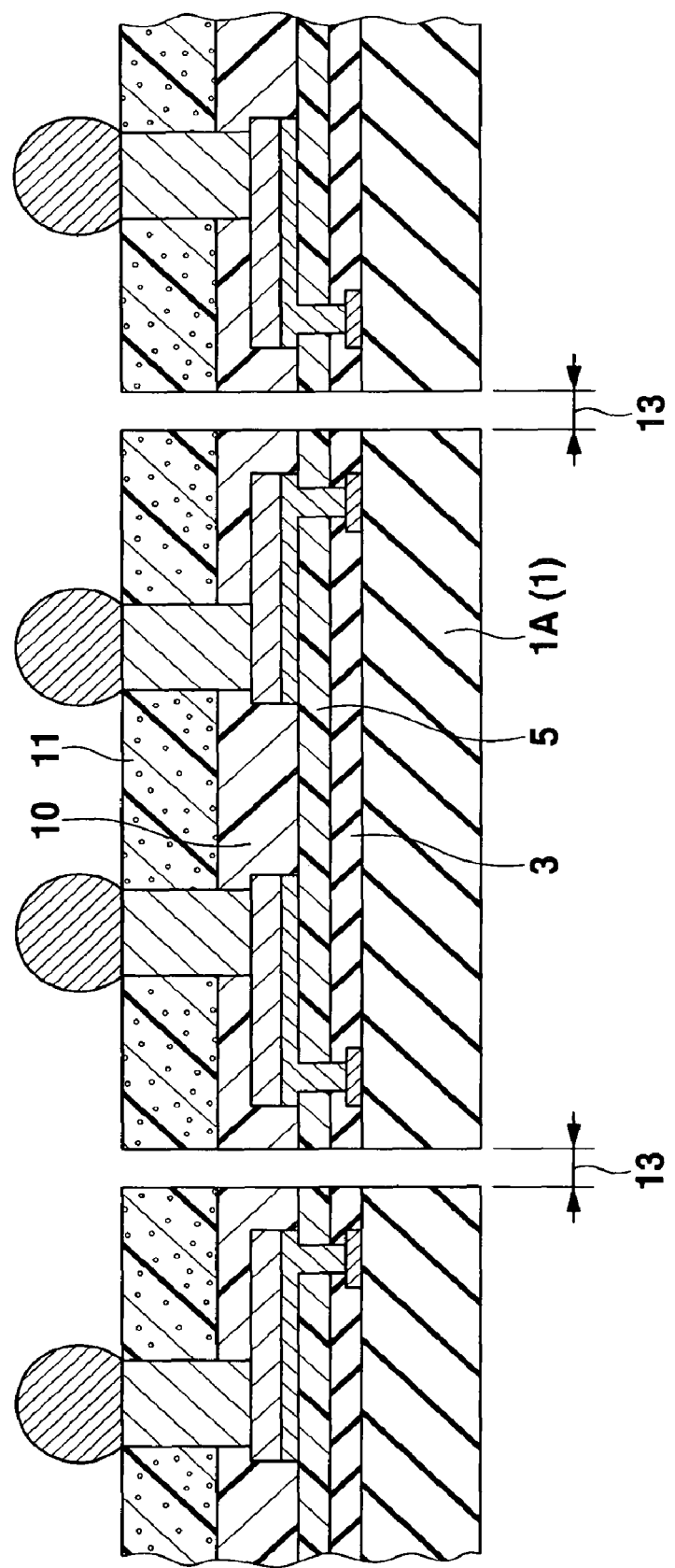
FIG. 7 is a sectional view for a step following FIG. 6.

Next, the upper sides of the second sealing film 11 and the columnar electrodes 9 are polished, such that the upper surfaces of the columnar electrodes 9 are exposed, and the upper side of the second sealing film 11 and the exposed upper sides of the columnar electrodes 9 are planarized, as shown in FIG. 5. Then, as shown in FIG. 6, the solder balls 12 are formed on the exposed upper surfaces of the columnar electrodes 9. Then, as shown in FIG. 7, the wafer 1A, the insulating film 3, the protective film 5 and the first and second sealing films 10 and 11 are cut along the dicing lines 13, thereby obtaining a plurality of semiconductor devices shown in FIG. 1.

Figure 8:
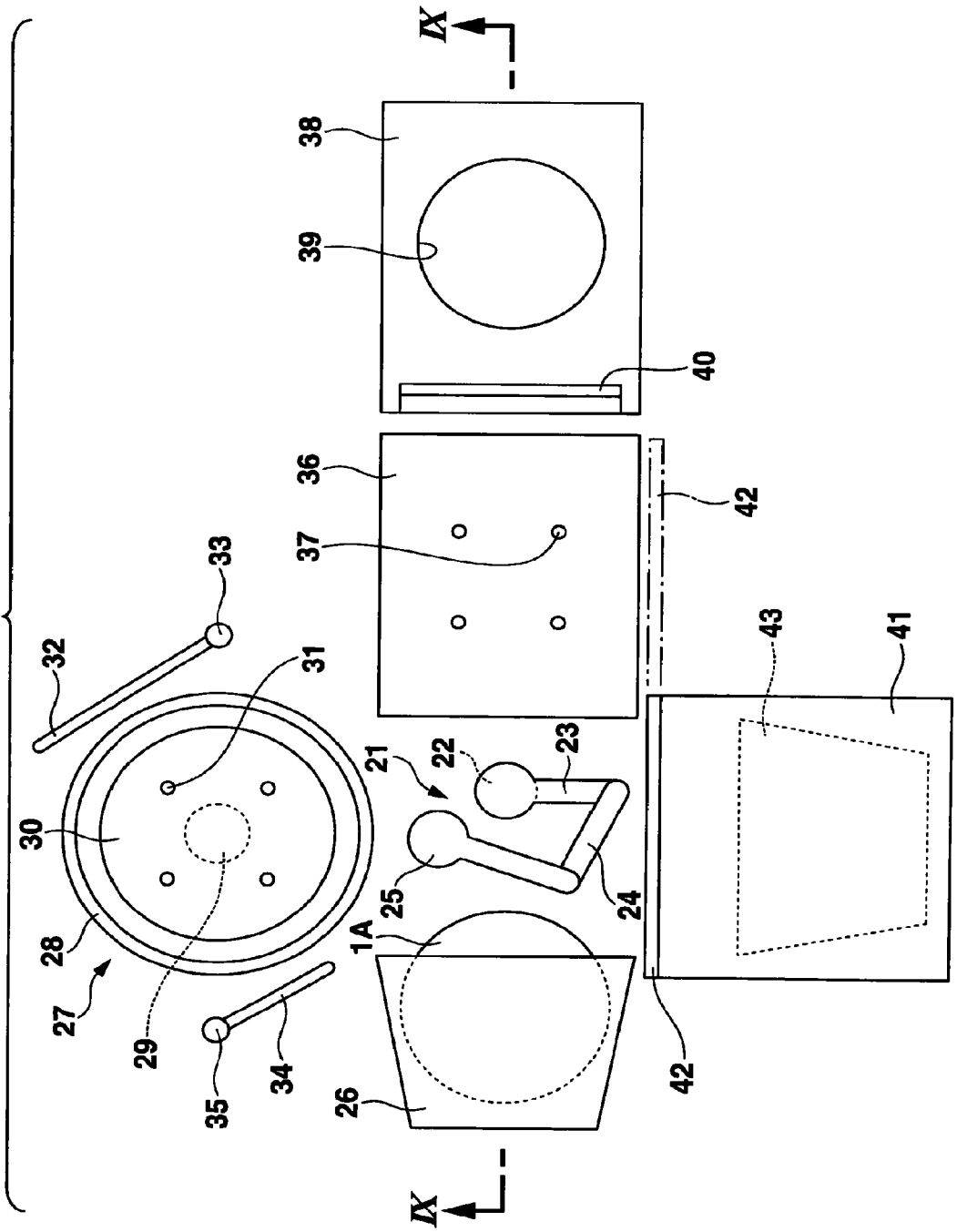
FIG. 8 is a schematic plan view of one example of a sealing film forming unit for forming first and second sealing films of the semiconductor device shown in FIG. 1.
Figure 9:
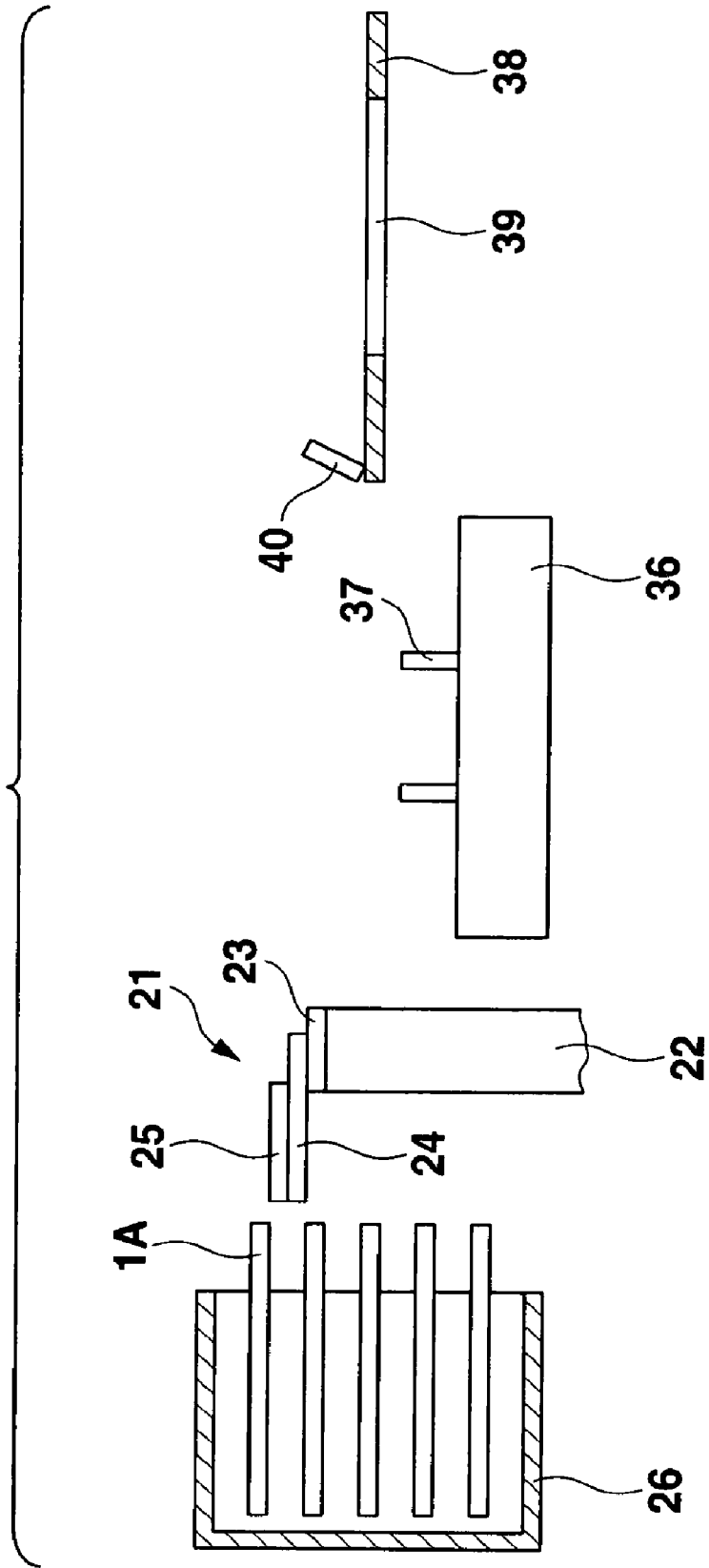
FIG. 9 is a schematic sectional view substantially along the IX-IX line in FIG. 8.

Next will be described a sealing film forming unit for forming the first and second sealing films 10 and 11 of the semiconductor device shown in FIG. 1. FIG. 8 is a schematic plan view of one example of the sealing film forming unit, and FIG. 9 is a schematic sectional view substantially along the IX-IX line in FIG. 8. This sealing film forming unit is equipped with wafer transferring means 21.

The wafer transferring mechanism or means 21 comprises a vertical support shaft 22 disposed movably in a vertical direction by a suitable driving mechanism. The proximal end of a first horizontal arm 23 is pivotally attached to the upper surface of the support shaft 22 via a pivot mechanism (not shown). The proximal end of a second horizontal arm 24 is pivotally attached to the upper surface of the distal end of the first arm 23 via a pivot mechanism (not shown). The proximal end of a third horizontal arm 25 is pivotally attached to the upper surface of the distal end of the second arm 24 via a pivot mechanism (not shown). The third arm 25 has a structure in which a vacuum suction mechanism (not shown) described later for vacuum-sucking the wafer 1A on the upper surface of the distal end of this third arm 25 is provided.

In FIGS. 8 and 9, a wafer cassette 26 is designed to be disposed at a predetermined position in the vicinity of the left side of the wafer transferring means 21. The wafer cassette 26 is open in one side (right side) at which the wafers 1A are inserted into the cassette 26 and taken out therefrom, The plurality of (in FIG. 9, five for convenience) wafers 1A are horizontally kept and placed at intervals in a vertical direction in the wafer cassette 26. The wafer 1A referred to here means a component in which the columnar electrode 9 is provided on the upper surface of the connection pad portion of each of the wiring lines 8 provided on the wafer 1A, as shown in FIG. 2.

Figure 13:
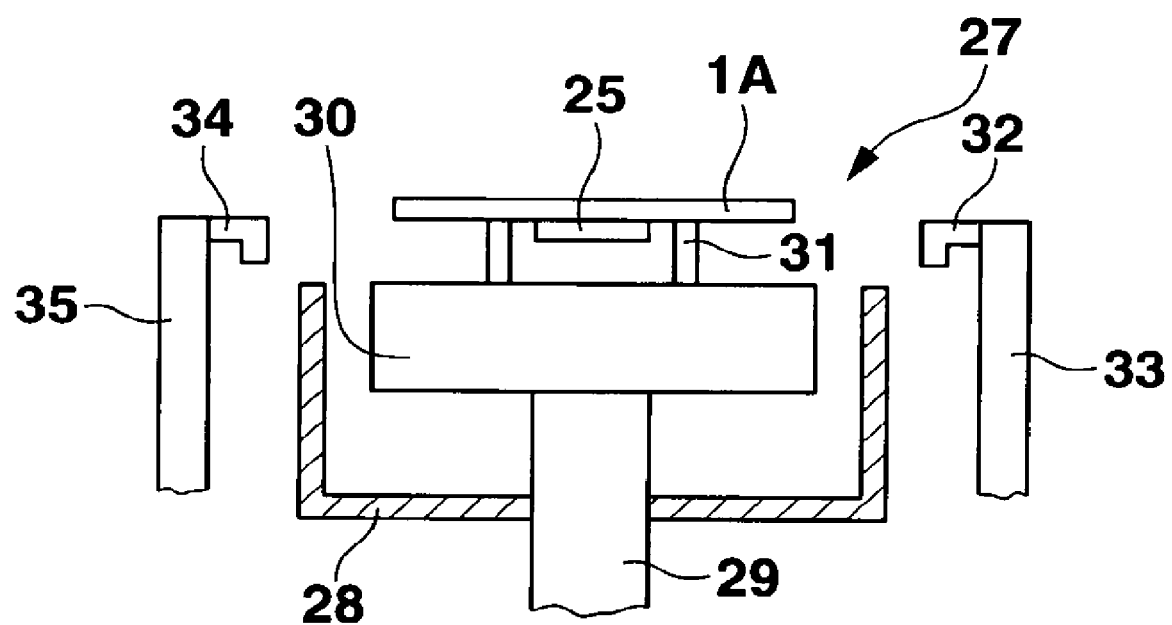
FIG. 13 is a schematic sectional view substantially along the XIII-XIII line in FIG. 12.

In FIG. 8, a spin coater 27 is disposed in the vicinity of the upper side of the wafer transferring means 21 (in the drawing). The spin coater 27 comprises a cup 28, as is also shown in FIG. 13. A rotation vertical shaft 29 is inserted through the center of the bottom of the cup 28 in a rotatable and vertically movable manner. A spin coat stage 30 is provided at the top of the rotation shaft 29. The spin coat stage 30 is structured to have a vacuum suction mechanism (not shown) for vacuum-sucking the wafer 1A on the upper surface of the stage 30, and to have a plurality of, for example, four support pins 31 which can appear on the upper side of this stage and is movable in a vertical direction.

A resin drop nozzle arm 32 is disposed pivotally with its support shaft 33 at a predetermined place outside the cup 28. An edge rinse nozzle arm 34 is disposed pivotally with its support shaft 35 at another predetermined place outside the cup 28. Then, in an initial condition shown in FIG. 8, the spin coat stage 30 is located at an upper limit position together with the rotation shaft 29, and the support pins 31 protrude from the upper surface of the stage, and moreover, both of the nozzle arms 32 and 34 are located outside the cup 28.

In FIGS. 8 and 9, a print stage 36 is disposed in the vicinity of the right side of the wafer transferring means 21 (in the drawing). The print stage 36 has a vacuum suction mechanism (not shown) for vacuum-sucking the wafer 1A on the upper surface of the stage 36, and has a plurality of, for example, four vertical support pins 37 which can appear on the upper side of this stage. In FIGS. 8 and 9, the print stage 36 is horizontally movable in left and right directions. In the initial state shown in FIGS. 8 and 9, by a suitable driving means (not shown), the print stage 36 is located at a leftward movement limit position, and the support pins 37 protrude from the upper surface of the stage.

In FIGS. 8 and 9, a metal mask 38 having a circular opening 39 is vertically (in a direction normal to the paper surface of the drawing) movably disposed in the vicinity of the right side of the print stage 36. A squeegee 40 is disposed on the upper side of the metal mask 38 movably in a predetermined direction (right and left directions in the drawing). Then, in the initial condition shown in FIGS. 8 and 9, by a suitable driving means (not shown), the metal mask 38 is located at an upper limit position together with the squeegee 40.

In FIG. 8, a vacuum deaerating case 41 is provided in the vicinity of the lower side of the wafer transferring means 21 (in the drawing). The vacuum deaerating case 41 can be entirely sealed when its door 42 is closed, and a vacuum is kept in the vacuum deaerating case 41 during an unshown vacuum pump is driven. Inside the vacuum deaerating case 41, a deaerating wafer cassette 43 having the same configuration as that of the wafer cassette 26 is disposed so that its open one side is located on the side of the door 42.

Next, the operation of this sealing film forming unit will be described. First, as shown in FIGS. 8 and 9, the wafer cassette 26 is disposed at a predetermined position on the left side of the wafer transferring means 21. In this case, a plurality of wafers 1A are placed at intervals in the vertical direction in the wafer cassette 26. Moreover, the door 42 of the vacuum deaerating case 41 is opened as indicated by a chain line in FIG. 8. In this case, no wafer is placed in the deaerating wafer cassette 43.

Figure 10:
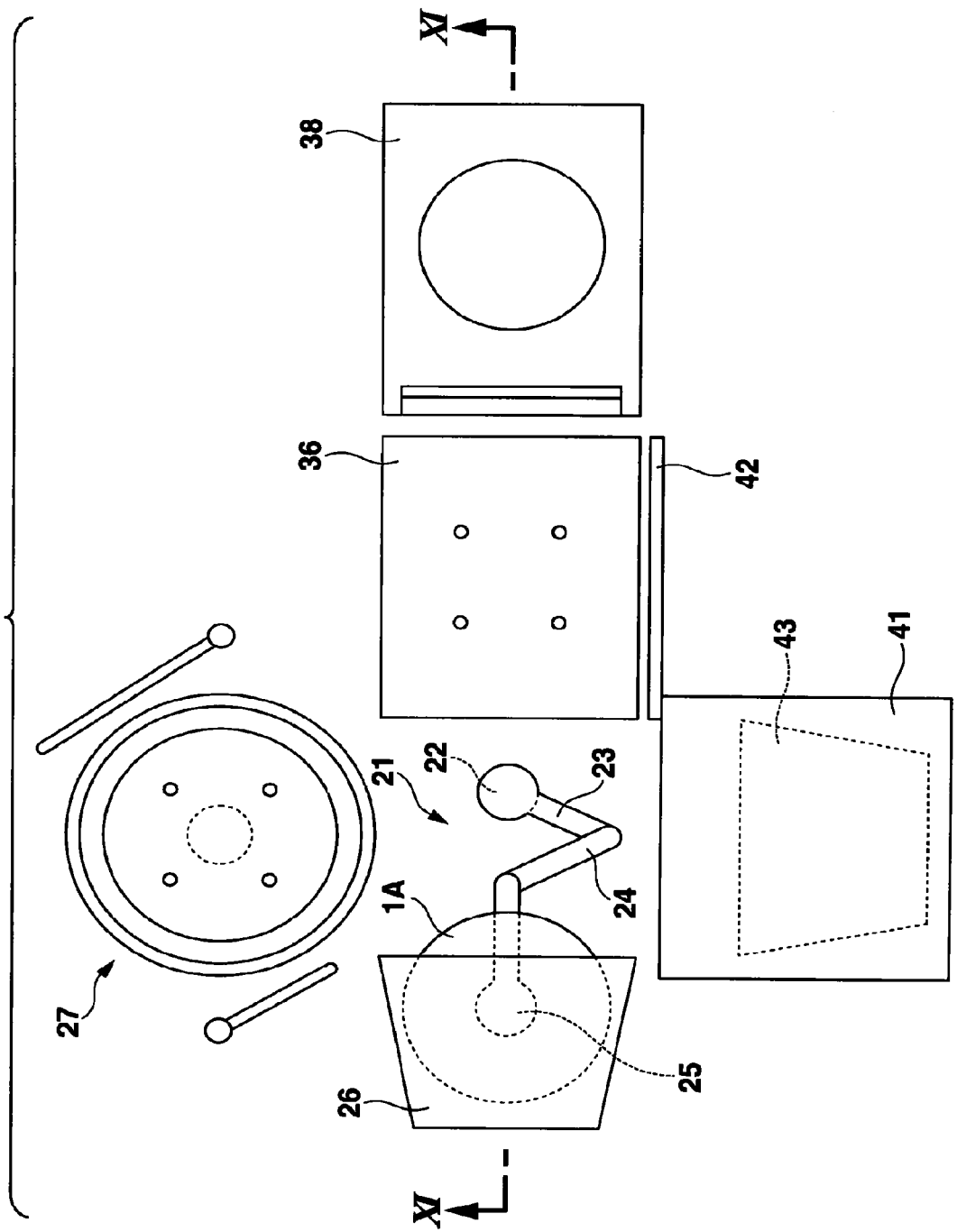
FIG. 10 is a schematic plan view of an initial step in forming the first and second sealing films using the sealing film forming unit shown in FIGS. 8 and 9.
Figure 11:
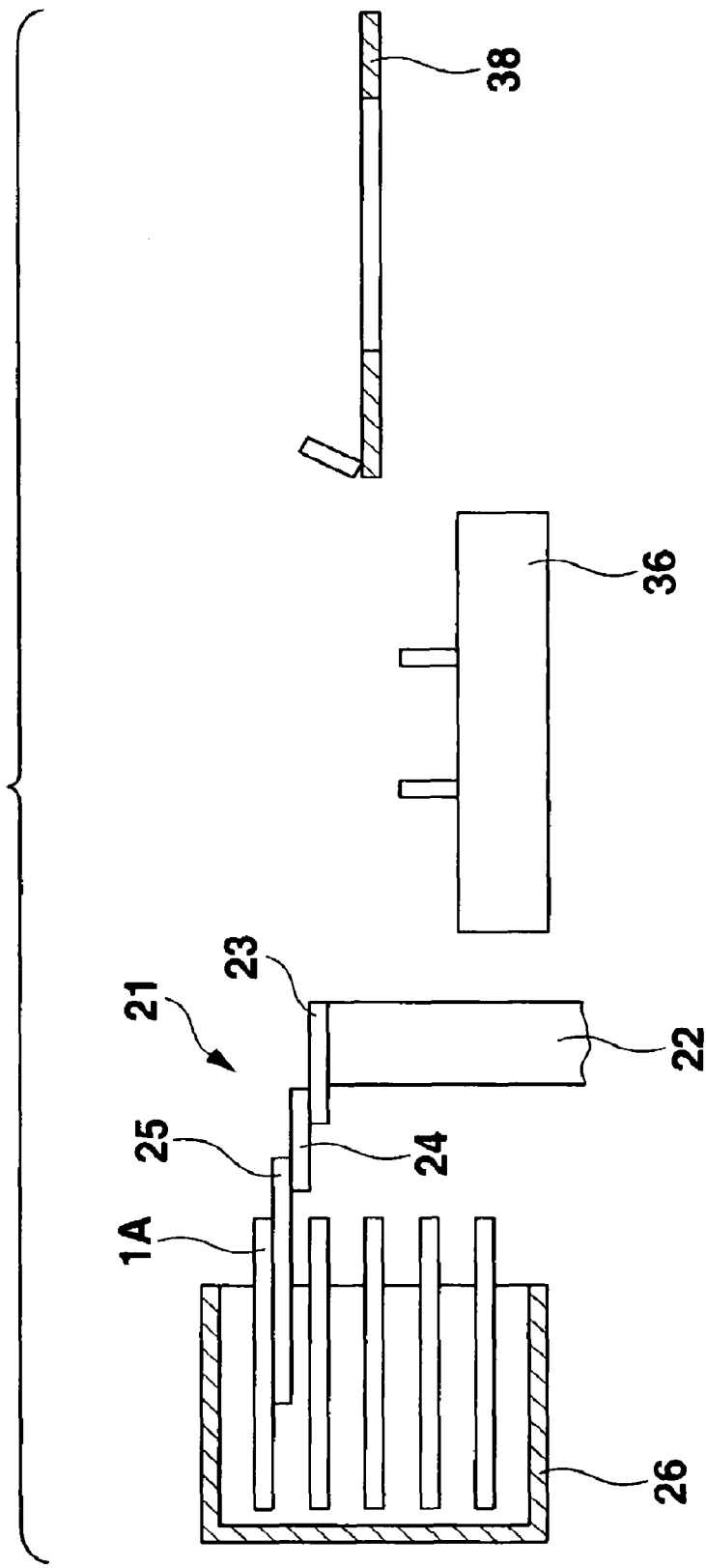
FIG. 11 is a schematic sectional view substantially along the XI-XI line in FIG. 10.

Next, as shown in FIGS. 10 and 11, the support shaft 22 of the wafer transferring means 21 is vertically moved, and the first to third arms 23 to 25 properly move within a horizontal plane, such that the distal end of the third arm 25 is located under the center of the lower surface of the wafer 1A placed at the top in the wafer cassette 26, and the center of the lower surface of the wafer 1A is vacuum-sucked onto the upper surface of the distal end of the third arm 25.

Figure 12:
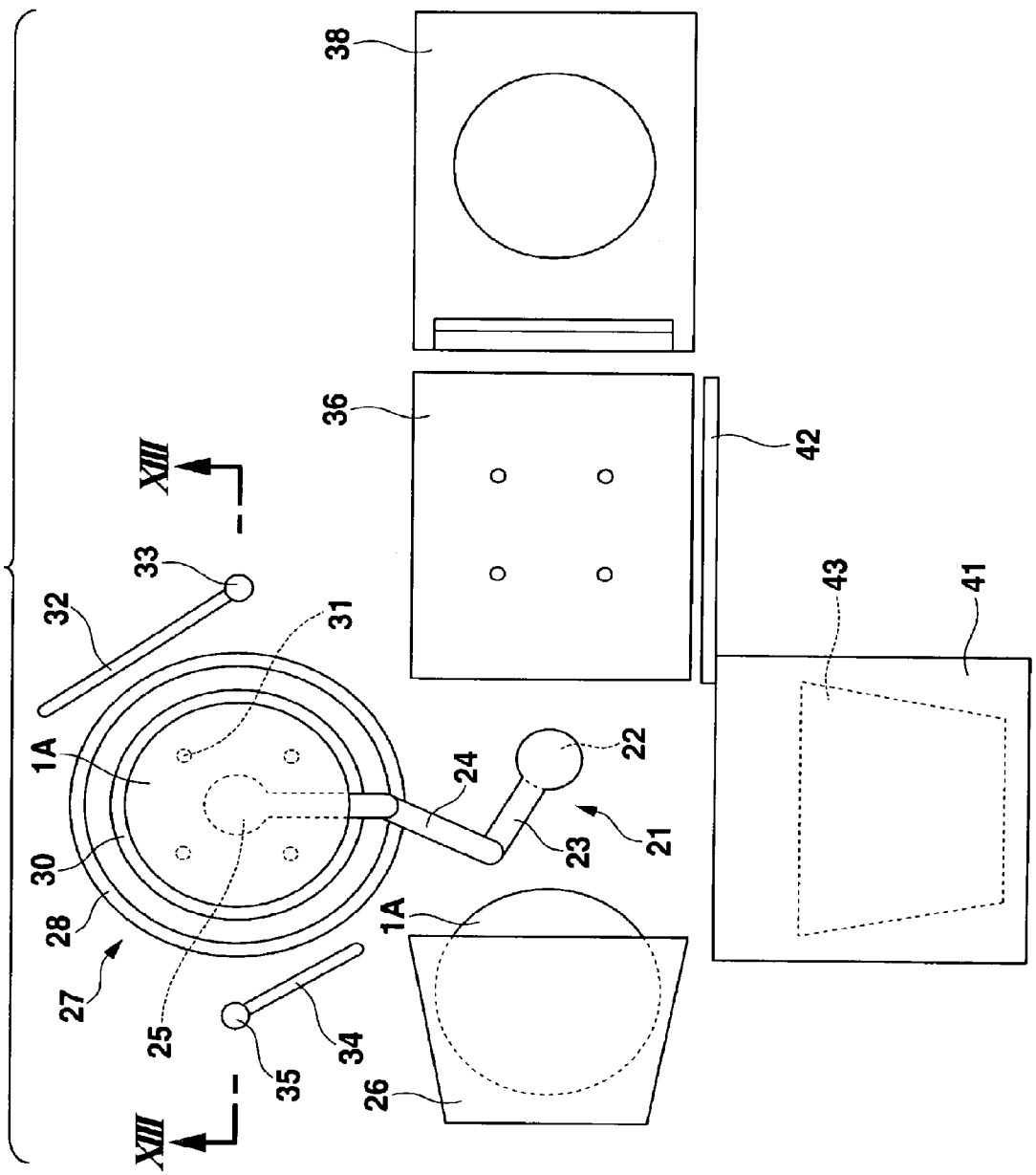
FIG. 12 is a schematic plan view for a step following FIGS. 10 and 11.

Next, as shown in FIGS. 12 and 13, the support shaft 22 and the first to third arms 23 to 25 of the wafer transferring means 21 properly move such that the lower surface of the wafer 1A vacuum-sucked onto the upper surface of the distal end of the third arm 25 is positioned and mounted on the plurality of support pins 31 protruding on the upper side of the spin coat stage 30. Then, the vacuum suction of the wafer 1A by the upper surface of the distal end of the third arm 25 is cancelled.

Figure 14:
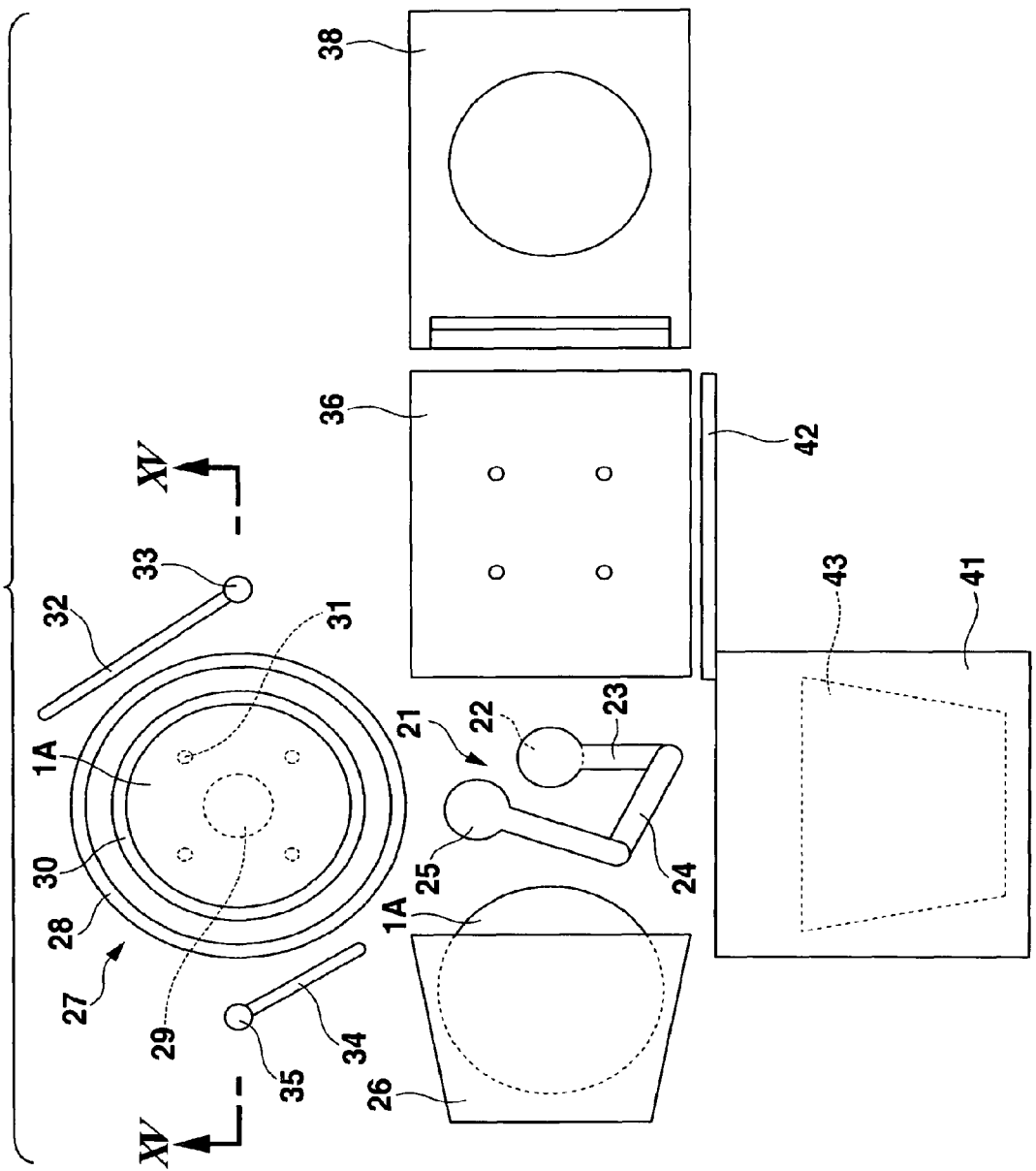
FIG. 14 is a schematic plan view for a step following FIGS. 12 and 13.
Figure 15:
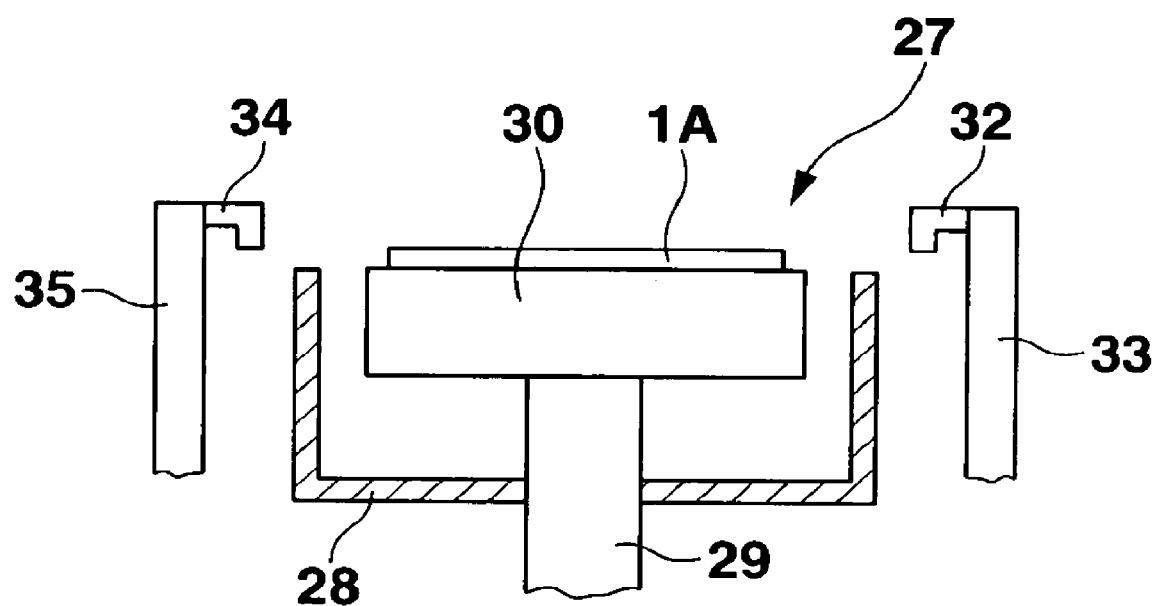
FIG. 15 is a schematic sectional view substantially along the XV-XV line in FIG. 14.

Next, as shown in FIGS. 14 and 15, the first to third arms 23 to 25 of the wafer transferring means 21 properly move and are located at initial positions shown in FIG. 8 in a planar view. The plurality of support pins 31 protruding on the upper side of the spin coat stage 30 descend and are completely inserted in the spin coat stage 30 such that the wafer 1A is mounted and vacuum-sucked onto a predetermined place or center of the upper surface of the spin coat stage 30.

Figure 16:
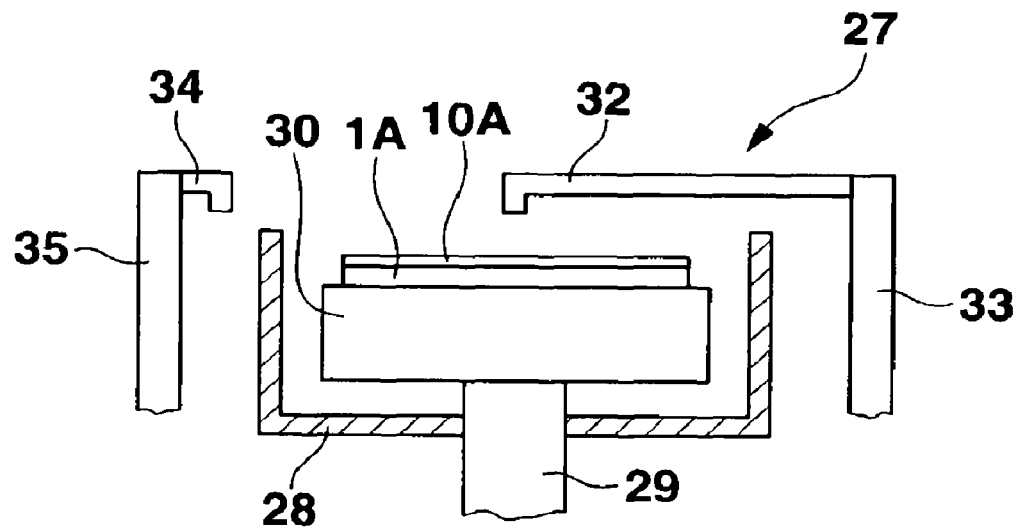
FIG. 16 is a schematic sectional view for a step following FIGS. 14 and 15.

Next, as shown in FIG. 16, the spin coat stage 30 descends by moving the rotation shaft 29 in a lower direction and is located at a lower limit position. Then, the resin drop nozzle arm 32 rotates by the limited rotation of the support shaft 33, thus bringing its distal end above the center of the wafer 1A vacuum-sucked onto the upper surface of the spin coat stage 30. Then, the shaft 29 is rotated to also rotate the spin coat stage 30 and thus the wafer 1A vacuum-sucked onto its upper surface, and a predetermined amount of a liquid resin is dropped onto the center of the wafer 1A from the distal end opening of the resin drop nozzle arm 32, so that the liquid resin is spread over the wafer 1A for forming the first formation film 10A on the entire upper surface of the wafer 1A (see FIG. 3).

In this case, while the thickness (thickness on the protective film 5 shown in FIG. 3) of the first formation film 10A is determined by the viscosity of the liquid resin, a rotation number, the amount of a solvent in the liquid resin, etc., it is only necessary that the gap between the wiring lines 8 shown in FIG. 3 be completely filled and the upper surface of the filled material be flat, and the thickness of the first formation film 10A is preferably about several μm. Further, the viscosity of the liquid resin is preferably 2000 cp or less. Moreover, in this case, as the first formation film 10A is formed in the atmosphere, air is caught into the second formation film 11A as air bubbles.

Figure 17:
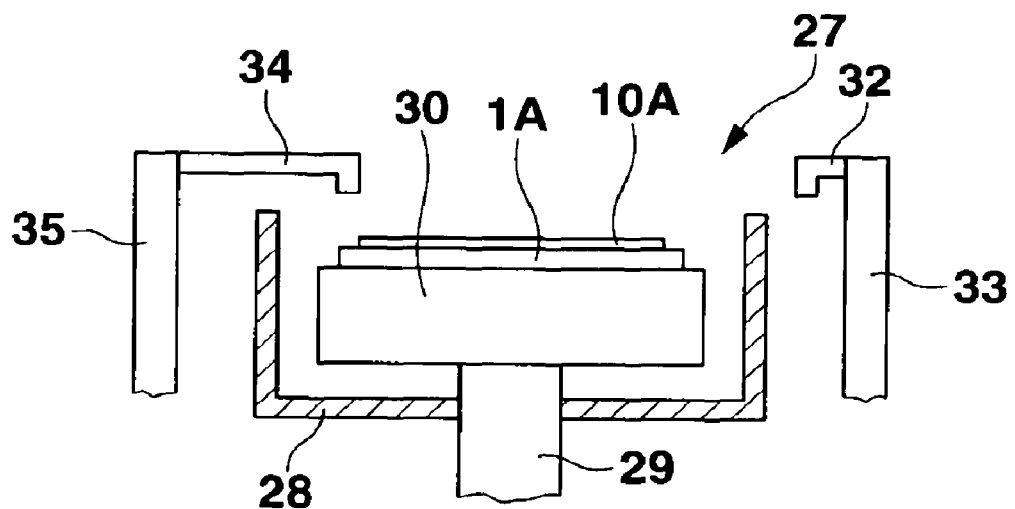
FIG. 17 is a schematic sectional view for a step following FIG. 16.

Next, as shown in FIG. 17, the resin drop nozzle arm 32 is rotated by the support shaft 33 to return to an initial position outside the cup 28. Then, the edge rinse nozzle arm 34 is rotated by the support shaft 35b so that its distal end is located above the peripheral part of the first formation film 10A on the wafer 1A supported by the stage 30. Then, the stage and thus the wafer 1A are rotated, and a rinse agent made of, for example, the same solution as the solution in the liquid resin is supplied onto the peripheral part of the first formation film 10A from the distal end port of the edge rinse nozzle arm 34. Thus the peripheral part of the first formation film 10A is removed, such that the peripheral part on the wafer 1A is exposed for use in alignment in the subsequent step. Thereafter, the edge rinse nozzle arm 34 is rotated by the support shaft 35 to return to an initial position outside the cup 28, and the rotation shaft 29 stops.

Figure 18:
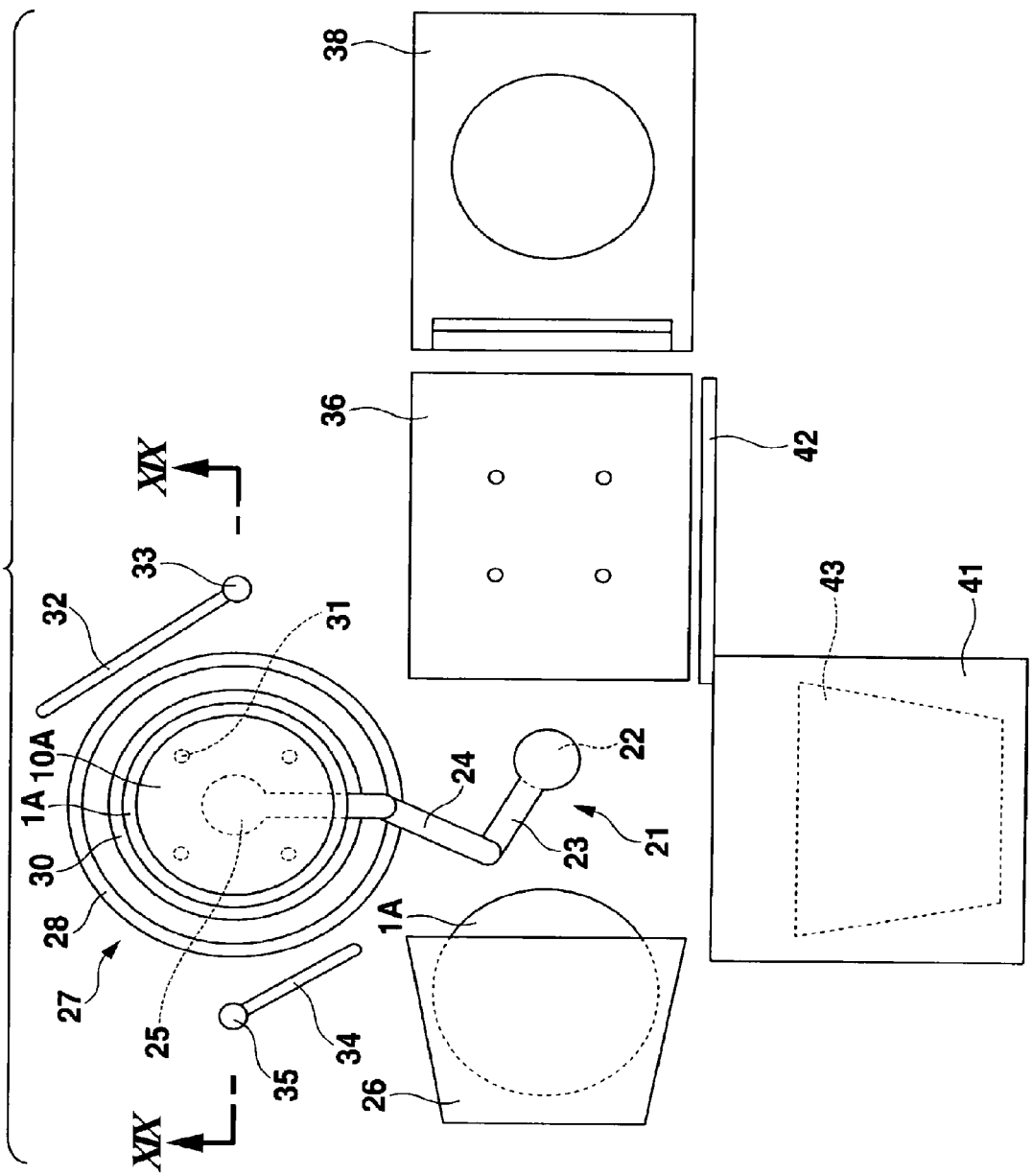
FIG. 18 is a schematic plan view for a step following FIG. 17.
Figure 19:
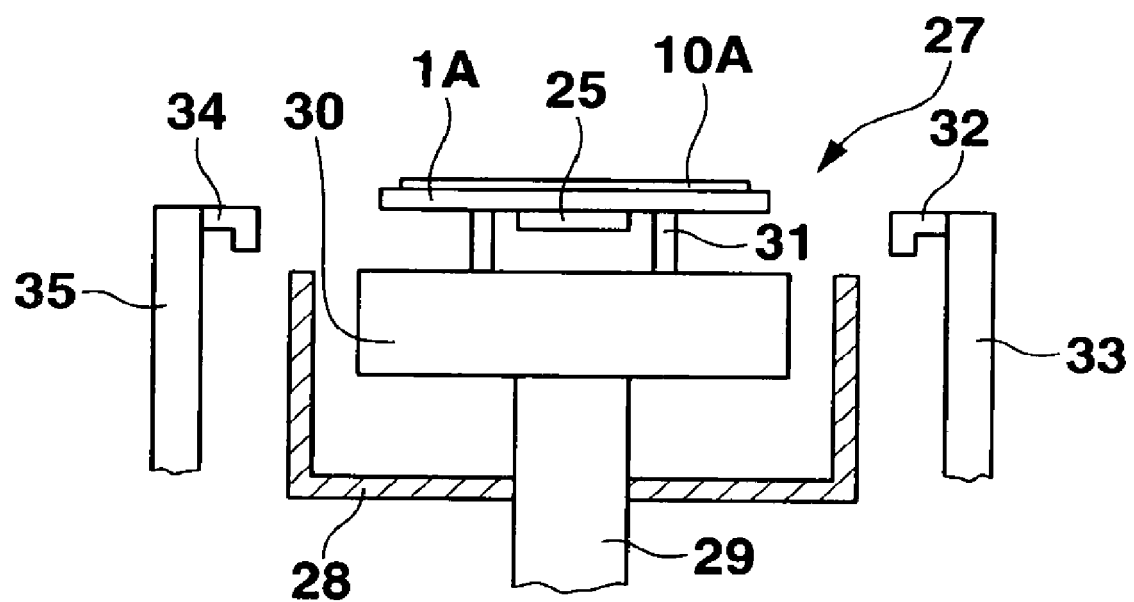
FIG. 19 is a schematic sectional view substantially along the IXX-IXX line in FIG. 18.

Next, as shown in FIGS. 18 and 19, the spin coat stage 30 is moved in an upper direction by the rotation shaft 29, and is located at an upper limit position. Then, the plurality of support pins 31 are upwardly protruded from the upper surface of the spin coat stage 30, so that the wafer 1A is properly lifted and supported by the support pins 31 above the upper surface of the spin coat stage 30. Then, the first to third arms 23 to 25 of the wafer transferring means 21 are properly moved such that the distal end of the third arm 25 is located under the center of the lower surface of the wafer 1A supported by the plurality of support pins 31, and the center of the lower surface of the wafer 1A is vacuum-sucked onto the upper surface of the distal end of the third arm 25.

Figure 20:
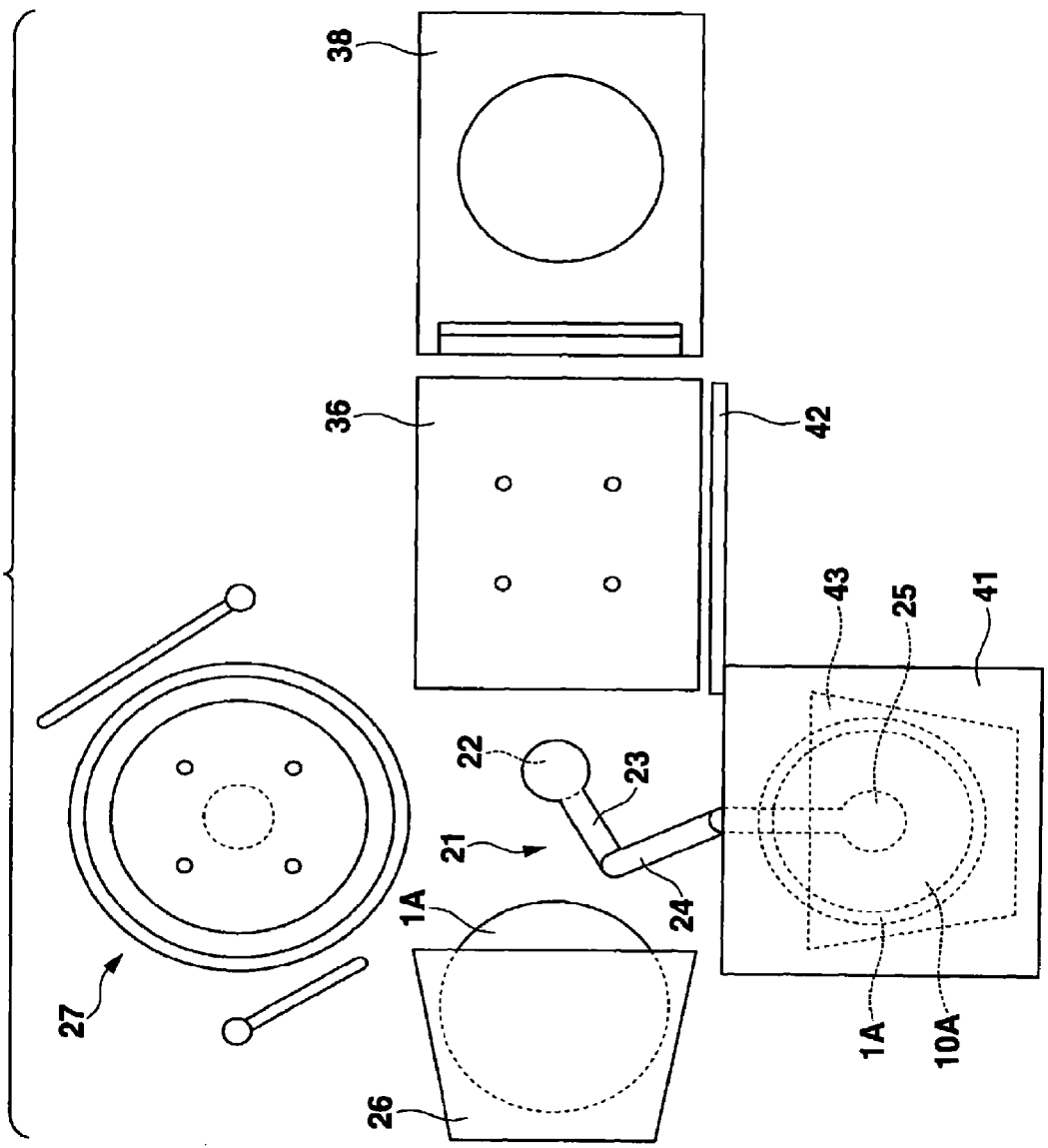
FIG. 20 is a schematic plan view for a step following FIGS. 18 and 19.

Next, as shown in FIG. 20, the support shaft 22 and the first to third arms 23 to 25 of the wafer transferring means 21 properly move such that the distal end of the third arm 25 and thus the wafer 1A thereon are transferred into the vacuum deaerating case 41 and further into a predetermined place within the deaerating wafer cassette 43, and then the wafer 1A vacuum-sucked onto the upper surface of the distal end of the third arm 25 is placed at the top (uppermost shelf) in the deaerating wafer cassette 43. Then, the vacuum suction of the wafer 1A by the upper surface of the distal end of the third arm 25 is cancelled.

Figure 21:
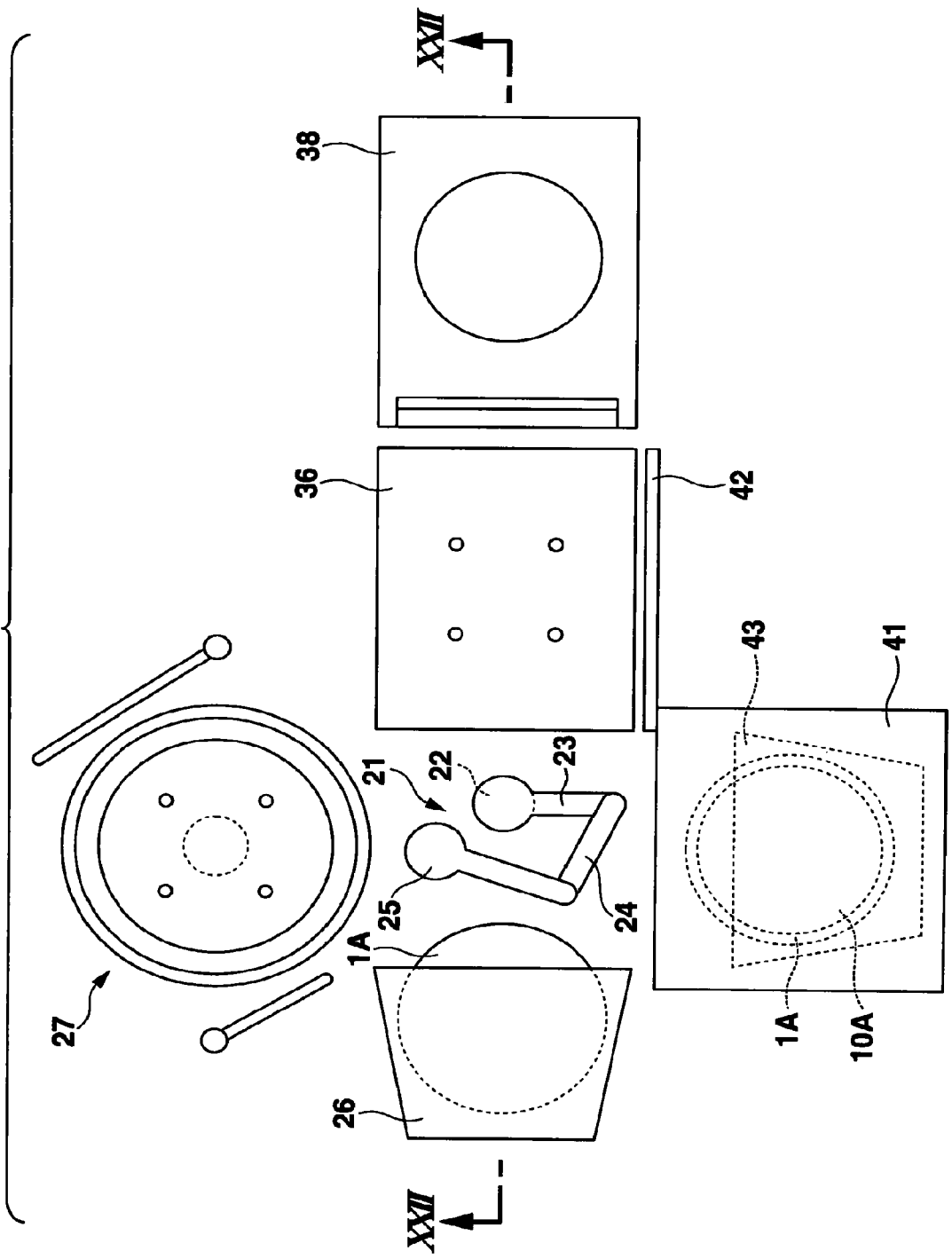
FIG. 21 is a schematic plan view for a step following FIG. 20.
Figure 22:
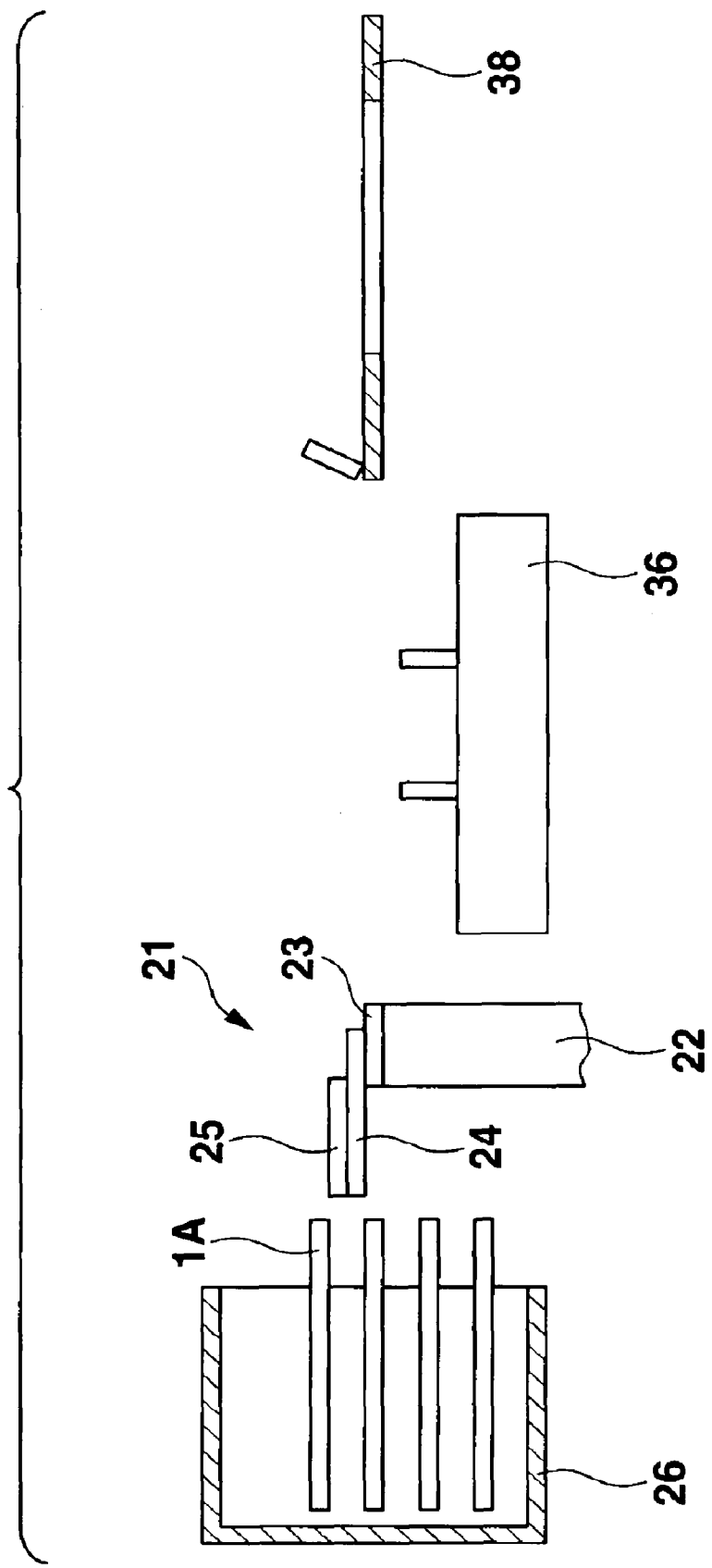
FIG. 22 is a schematic sectional view substantially along the XXII-XXII line in FIG. 21.

Next, as shown in FIGS. 21 and 22, the support shaft 22 and the first to third arms 23 to 25 of the wafer transferring means 21 are properly moved and located at the initial positions shown in FIG. 8 in a planar view. In this case, the height of the support shaft 22 is adjusted so that the distal end of the third arm 25 is located at a position at which it is located under the next wafer 1A placed at the second position from the top in the wafer cassette 26.

Furthermore, the operation as described above is repeated, such that the wafer 1A placed at the second position from the top in the wafer cassette 26 is taken out, and the first sealing film formation film 10A is formed on this wafer 1A taken out, and then this wafer 1A is placed at the second position from the top in the deaerating wafer cassette 43. Subsequently, similar operations are repeated, such that the wafers 1A placed at the third and subsequent positions from the top in the wafer cassette 26 are sequentially taken out, and the first sealing film formation films 10A are formed on these wafers 1A taken out, and then these wafers 1A are placed at the third and subsequent positions from the top in the deaerating wafer cassette 43.

Then, the door 42 is closed, so that the vacuum deaerating case 41 is sealed. Further, the vacuum pump (not shown) is driven to evacuate the inner space of the vacuum deaerating case 41, thereby removing at a time air bubbles scattered within the first formation films 10A on all the wafers 1A placed in the deaerating wafer cassette 43. Then, the vacuum pump is stopped, and the air is brought back into the vacuum deaerating case 41.

Here, the time for forming the first formation film 10A by the spin coating is about 60 seconds at most, but the sum of exhaust time by the vacuum pump and the time for bringing the air back into the vacuum deaerating case 41 is relatively long and about 3 to 20 minutes, so that deaerating the plurality of wafers 1A at a time can reduce the whole processing time.

Then, the door 42 is opened. Further, the support shaft 22 and the first to third arms 23 to 25 of the wafer transferring means 21 are properly moved to sequentially take out all the wafers 1A placed in the deaerating wafer cassette 43, and these wafers 1A taken out are returned to the original positions in the wafer cassette 26.

Figure 23:
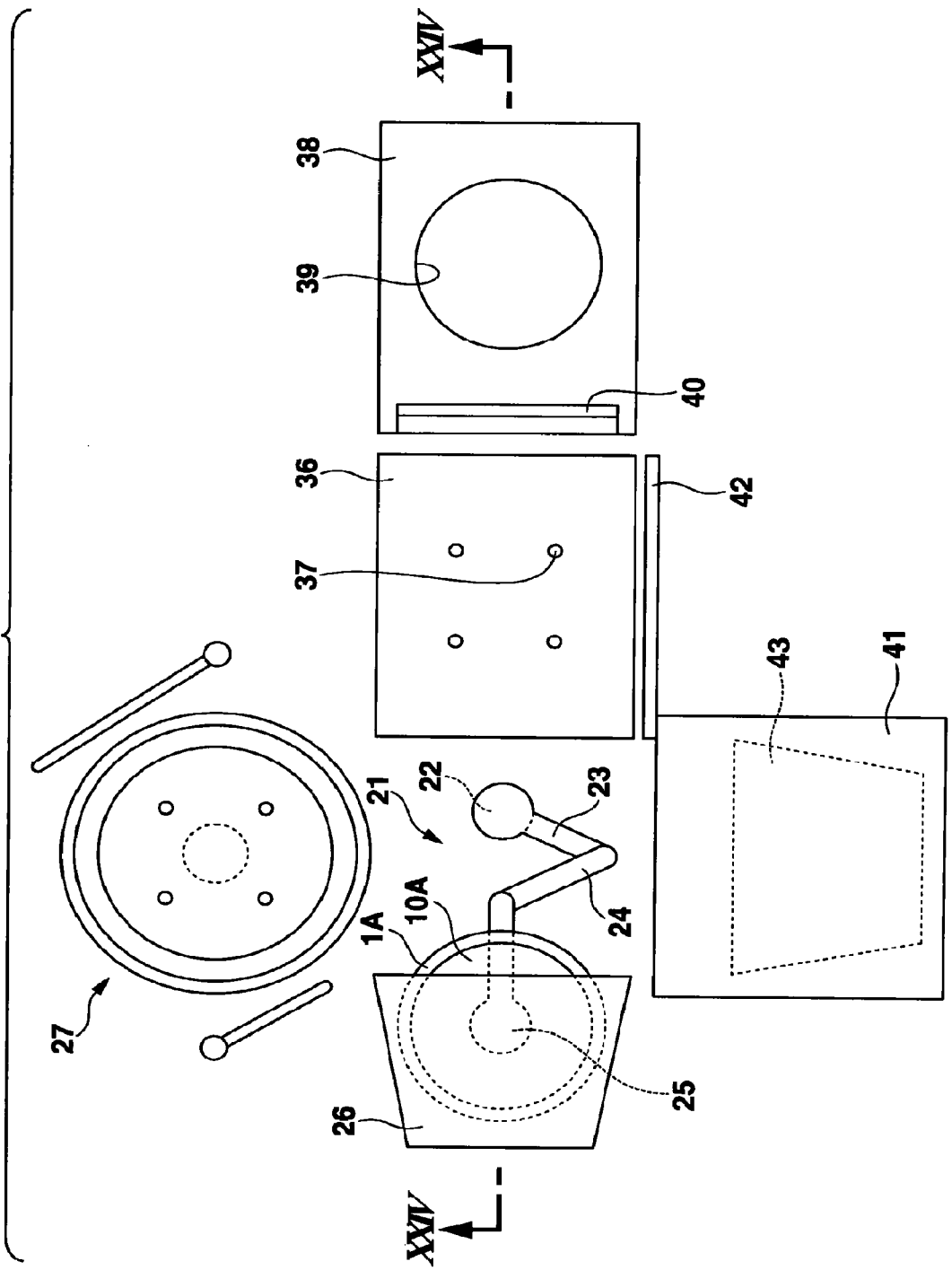
FIG. 23 is a schematic plan view for a step following FIGS. 21 and 22.
Figure 24:
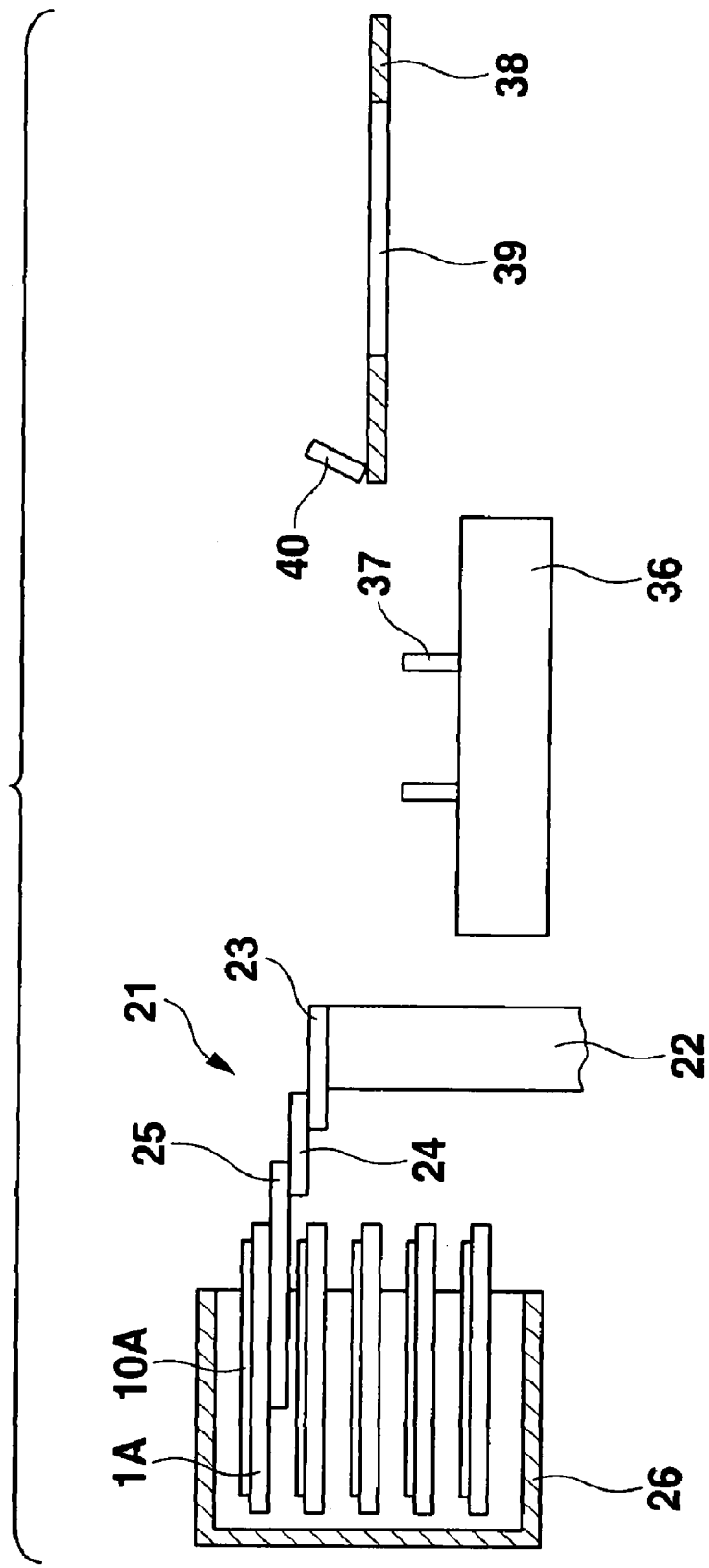
FIG. 24 is a schematic sectional view substantially along the XXIV-XXIV line in FIG. 23.

Then, as shown in FIGS. 23 and 24, the support shaft 22 and the first to third arms 23 to 25 of the wafer transferring means 21 are properly moved to locate the distal end of the third arm 25 under the center of the lower surface of the wafer 1A placed at the top in the wafer cassette 26, and the center of the lower surface of the wafer 1A is vacuum-sucked onto the upper surface of the distal end of the third arm 25.

Figure 25:
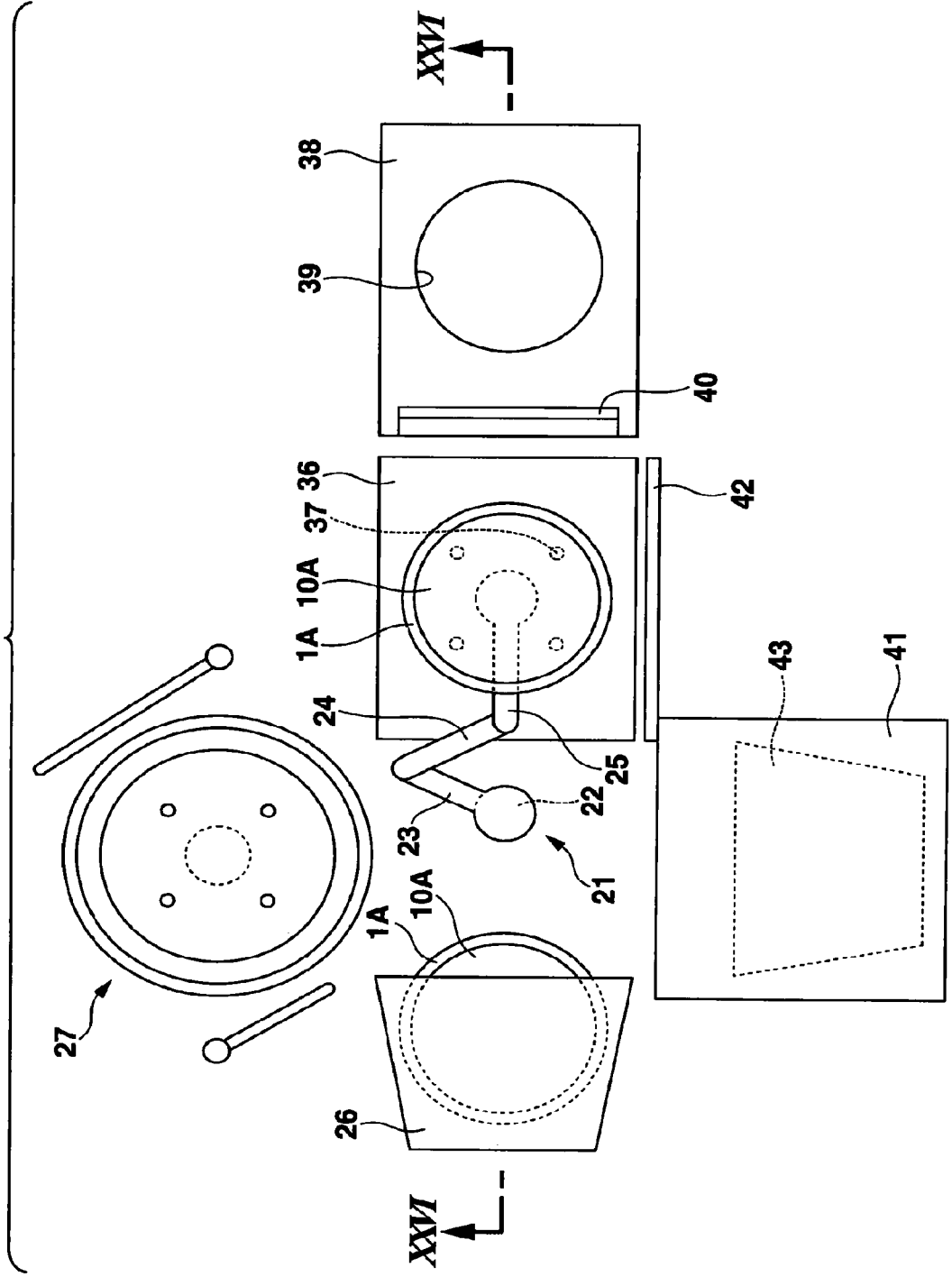
FIG. 25 is a schematic plan view for a step following FIGS. 23 and 24.
Figure 26:
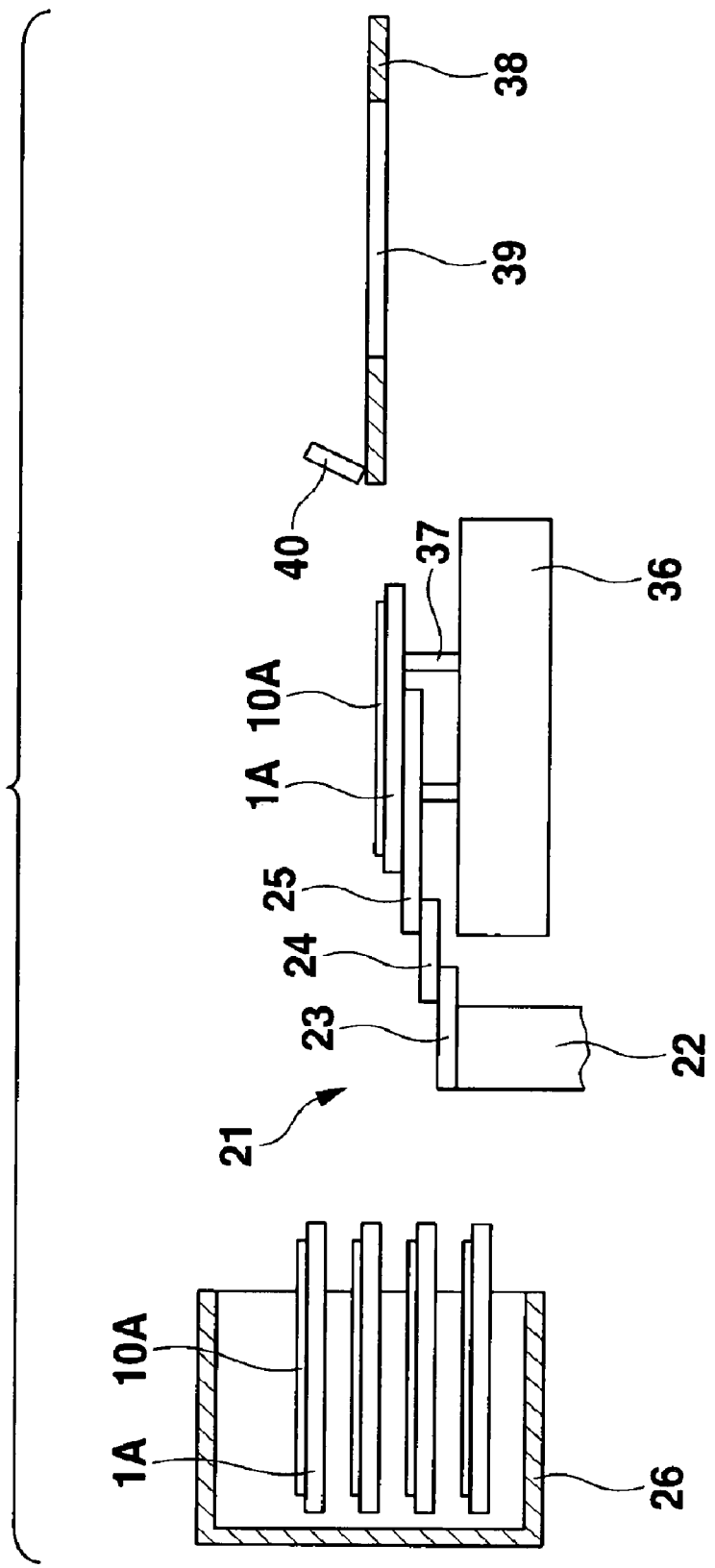
FIG. 26 is a schematic sectional view substantially along the XXVI-XXVI line in FIG. 25.

Then, as shown in FIGS. 25 and 26, the support shaft 22 and the first to third arms 23 to 25 of the wafer transferring means 21 are properly moved such that the lower surface of the wafer 1A vacuum-sucked onto the upper surface of the distal end of the third arm 25 is positioned and mounted on the plurality of support pins 37 protruding on the upper side of the print stage 36. Then, the vacuum suction of the wafer 1A by the upper surface of the distal end of the third arm 25 is cancelled.

Figure 27:
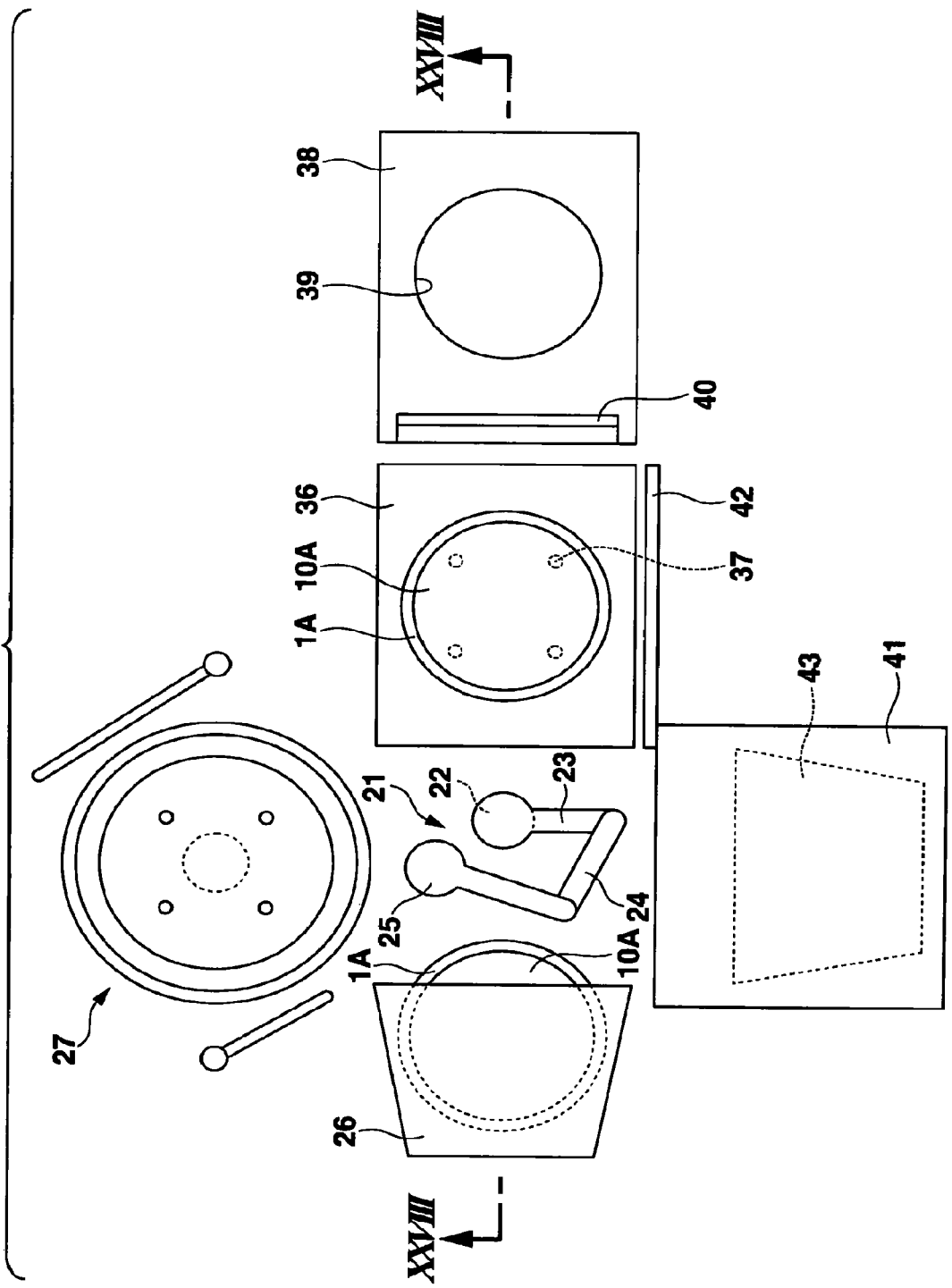
FIG. 27 is a schematic plan view for a step following FIGS. 25 and 26.
Figure 28:
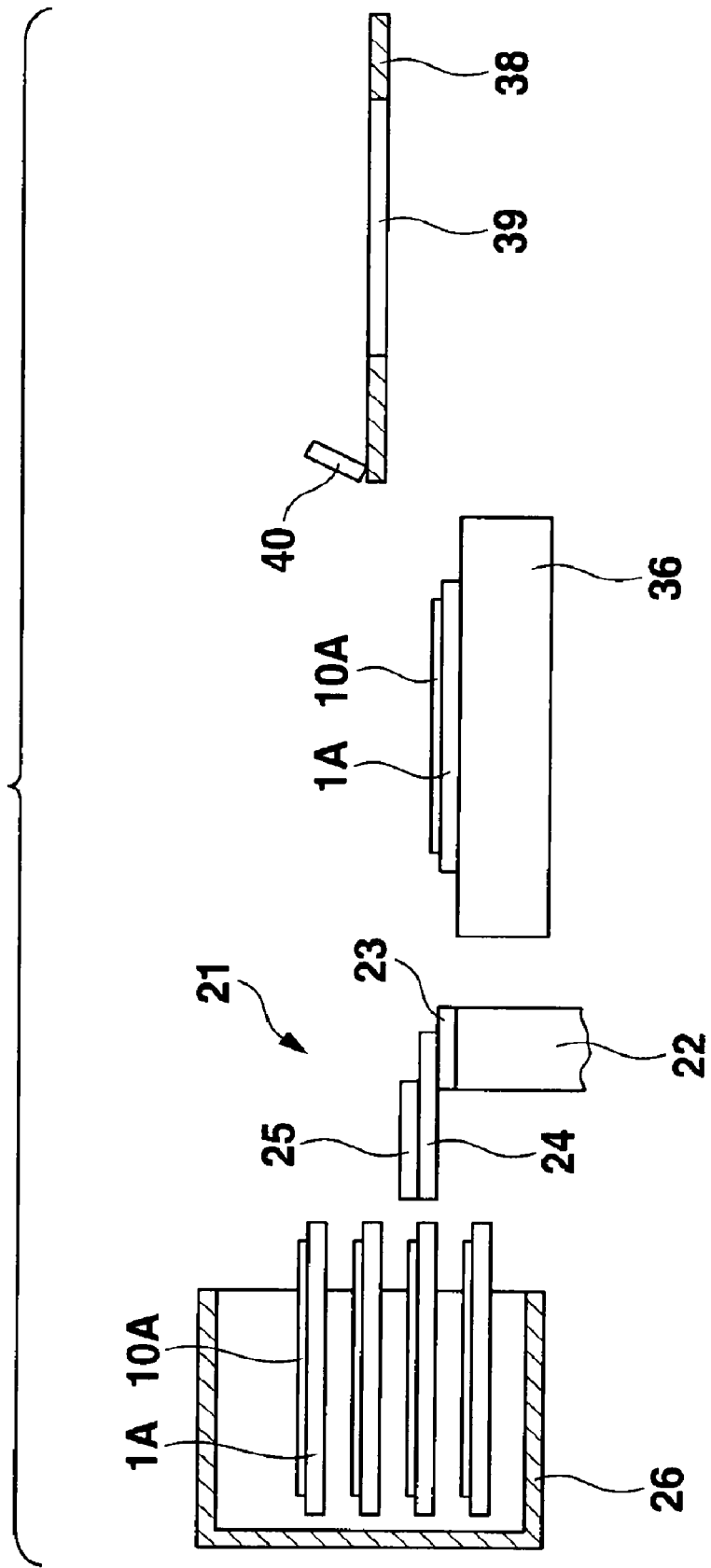
FIG. 28 is a schematic sectional view substantially along the XXVIII-XXVIII line in FIG. 27.

Next, as shown in FIGS. 27 and 28, the first to third arms 23 to 25 of the wafer transferring means 21 are properly moved and located at the initial positions shown in FIG. 8 in a planar view. Then, the plurality of support pins 37 protruding on the upper side of the print stage 36 descend and are located within the print stage 36 such that the wafer 1A is mounted and vacuum-sucked onto a predetermined place of the upper surface of the print stage 36.

Figure 29:
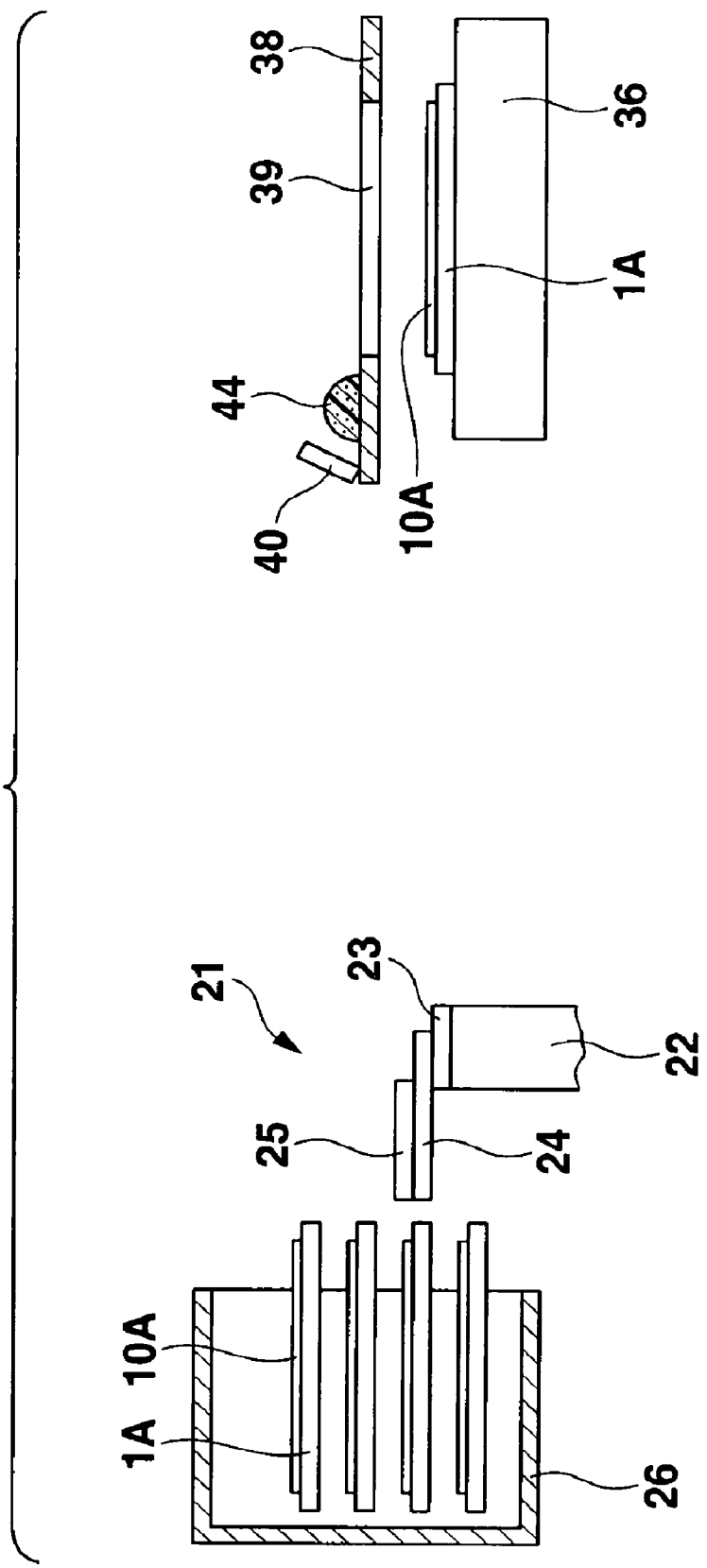
FIG. 29 is a schematic sectional view for a step following FIGS. 27 and 28.

Next, as shown in FIG. 29, the print stage 36 is moved rightward and located at a rightward movement limit position under the metal mask 38 located at the upper limit position. In this condition, a sealing material 44 made of a liquid resin containing fillers is supplied, by unshown liquid resin supply means, to the upper surface of the metal mask 38 on the right of the squeegee 40 located at a leftward movement limit position.

Figure 30:
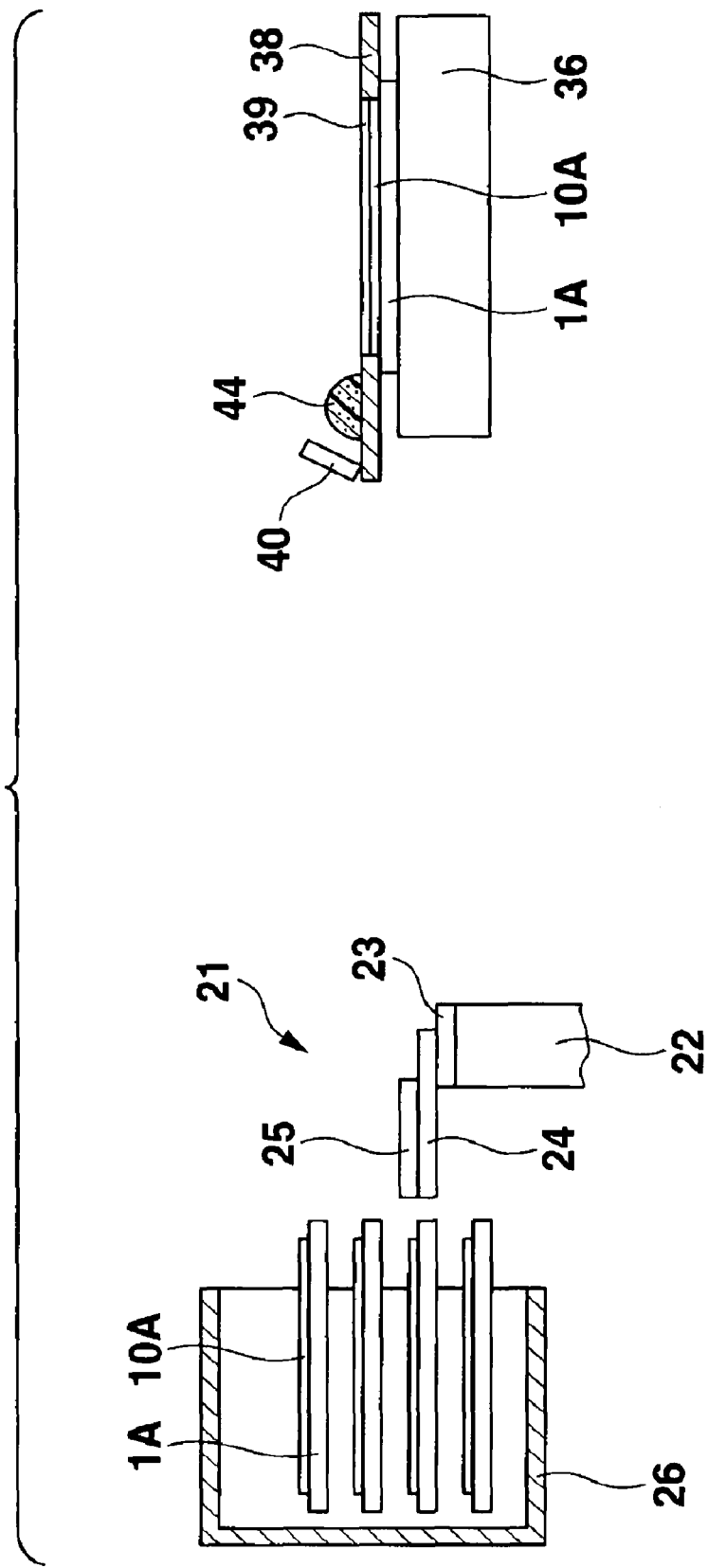
FIG. 30 is a schematic sectional view for a step following FIG. 29.

Next, as shown in FIG. 30, the metal mask 38 descends together with the squeegee 40 by a suitable driving means, and the lower surface of the metal mask 38 around the opening 39 is mounted on the upper surface of the peripheral part of the wafer 1A vacuum-sucked onto the print stage 36. In this case, the planar size of the opening 39 of the metal mask 38 is the same as the planar size of the first formation film 10A formed on the wafer 1A. Thus, the first formation film 10A is disposed within the opening 39 of the metal mask 38.

Figure 31:
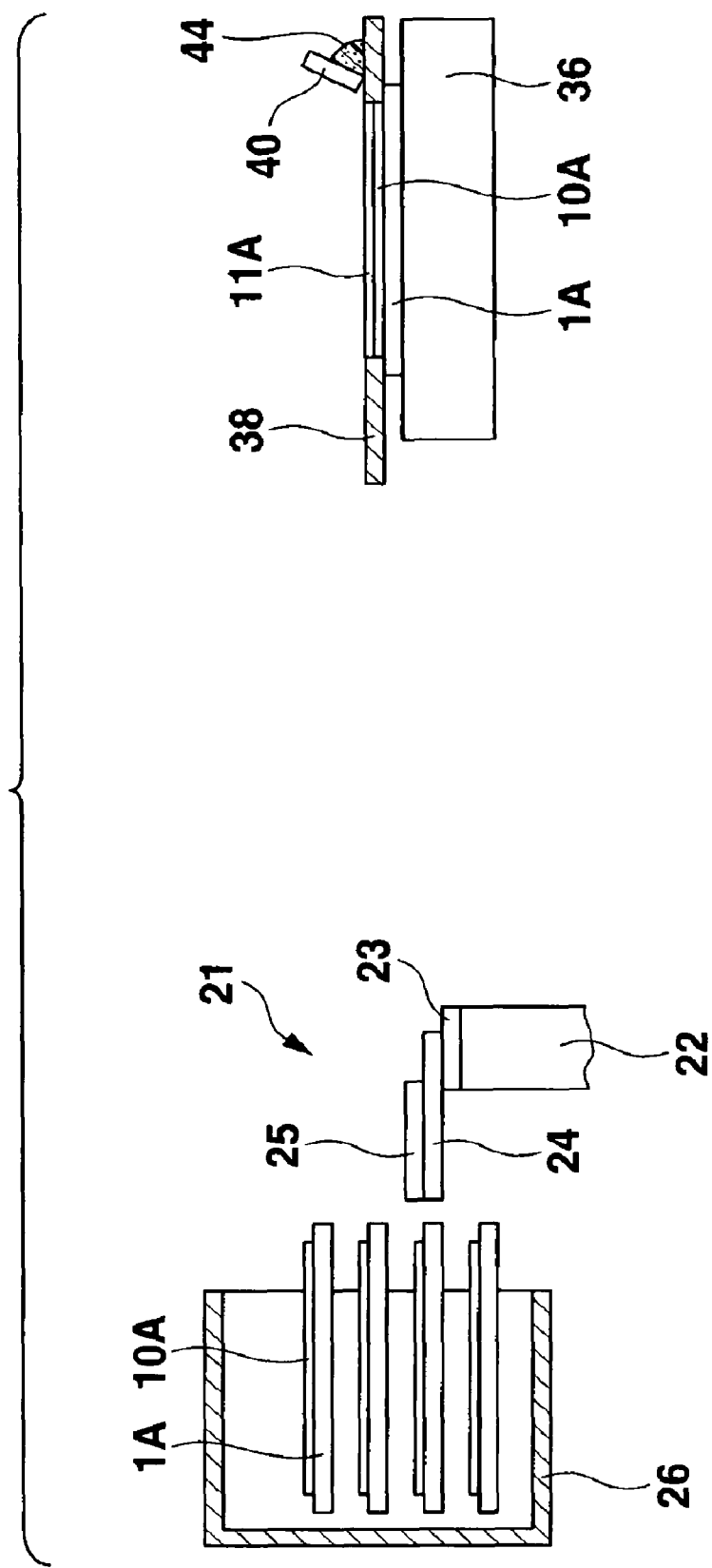
FIG. 31 is a schematic sectional view for a step following FIG. 30.

Next, as shown in FIG. 31, the squeegee 40 is moved rightward on the metal mask 38, such that the second formation film 11A made of the sealing material 44 is formed on the upper surface of the first formation film 10A within the opening 39 of the metal mask 38 (see FIG. 4). In this case, since the screen printing is carried out in the atmosphere, air is caught into the second formation film 11A as air bubbles.

Figure 32:
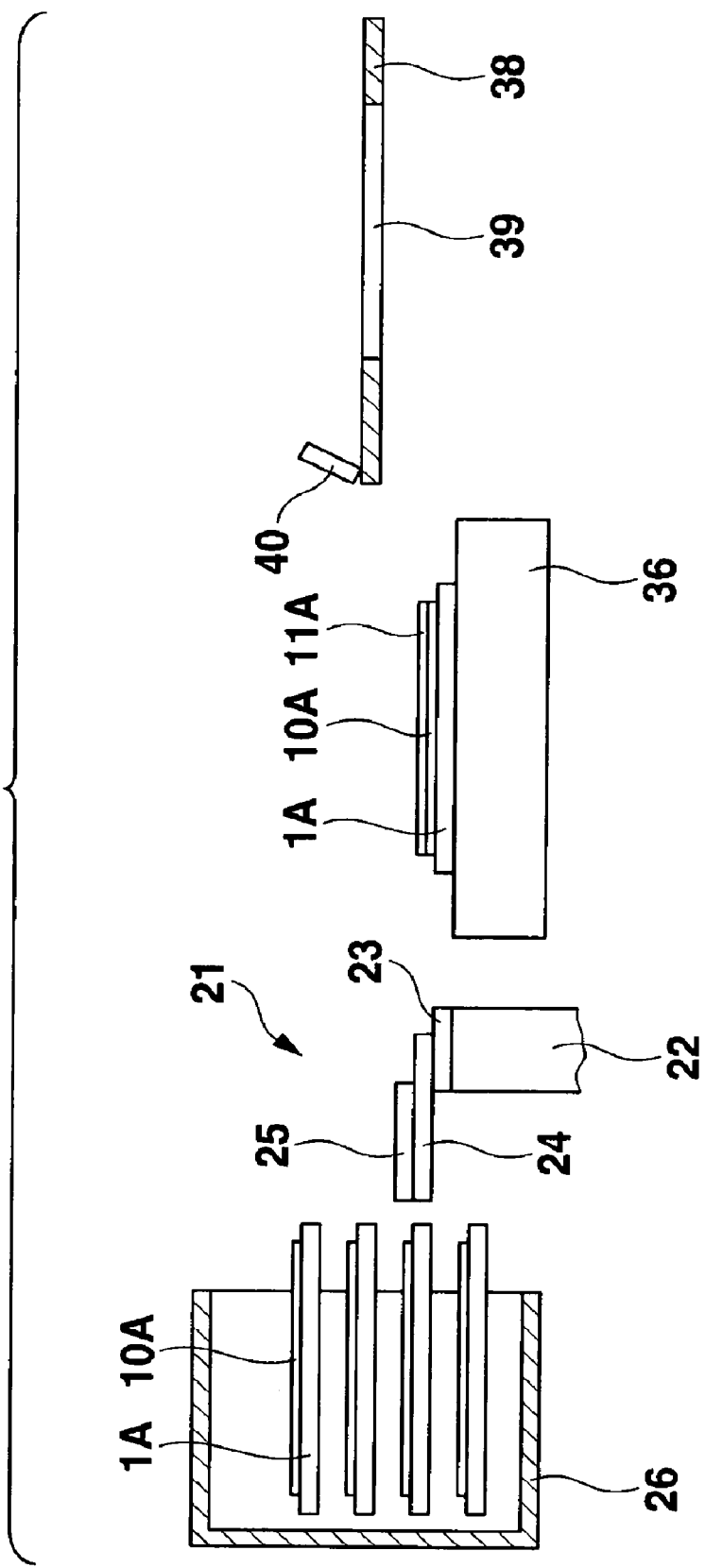
FIG. 32 is a schematic sectional view for a step following FIG. 31.

Next, as shown in FIG. 32, the metal mask 38 ascends together with the squeegee 40 back to the initial upper limit position. In this case, the squeegee 40 moves leftward at an appropriate point and returns to the initial leftward movement limit position. Further, the print stage 36 is moved leftward and returned to the initial leftward movement limit position.

Figure 33:
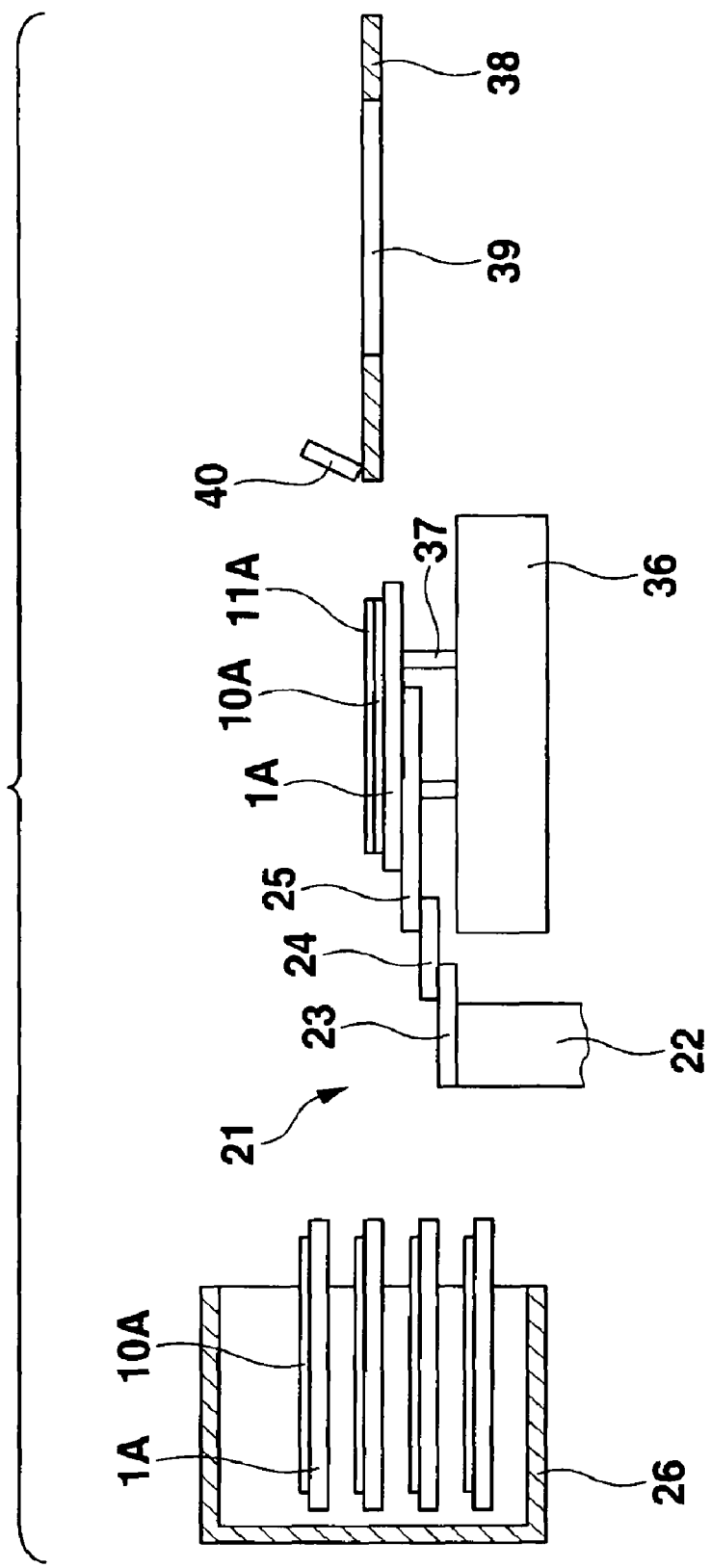
FIG. 33 is a schematic sectional view for a step following FIG. 32.

Next, as shown in FIG. 33, the plurality of support pins 37 protrude onto the upper side of the print stage 36, and the wafer 1A is properly lifted by and supported on the support pins 37. Then, the first to third arms 23 to 25 of the wafer transferring means 21 are properly moved such that the distal end of the third arm 25 is located under the center of the lower surface of the wafer 1A supported by the plurality of support pins 37, and the center of the lower surface of the wafer 1A is vacuum-sucked onto the upper surface of the distal end of the third arm 25.

Figure 34:
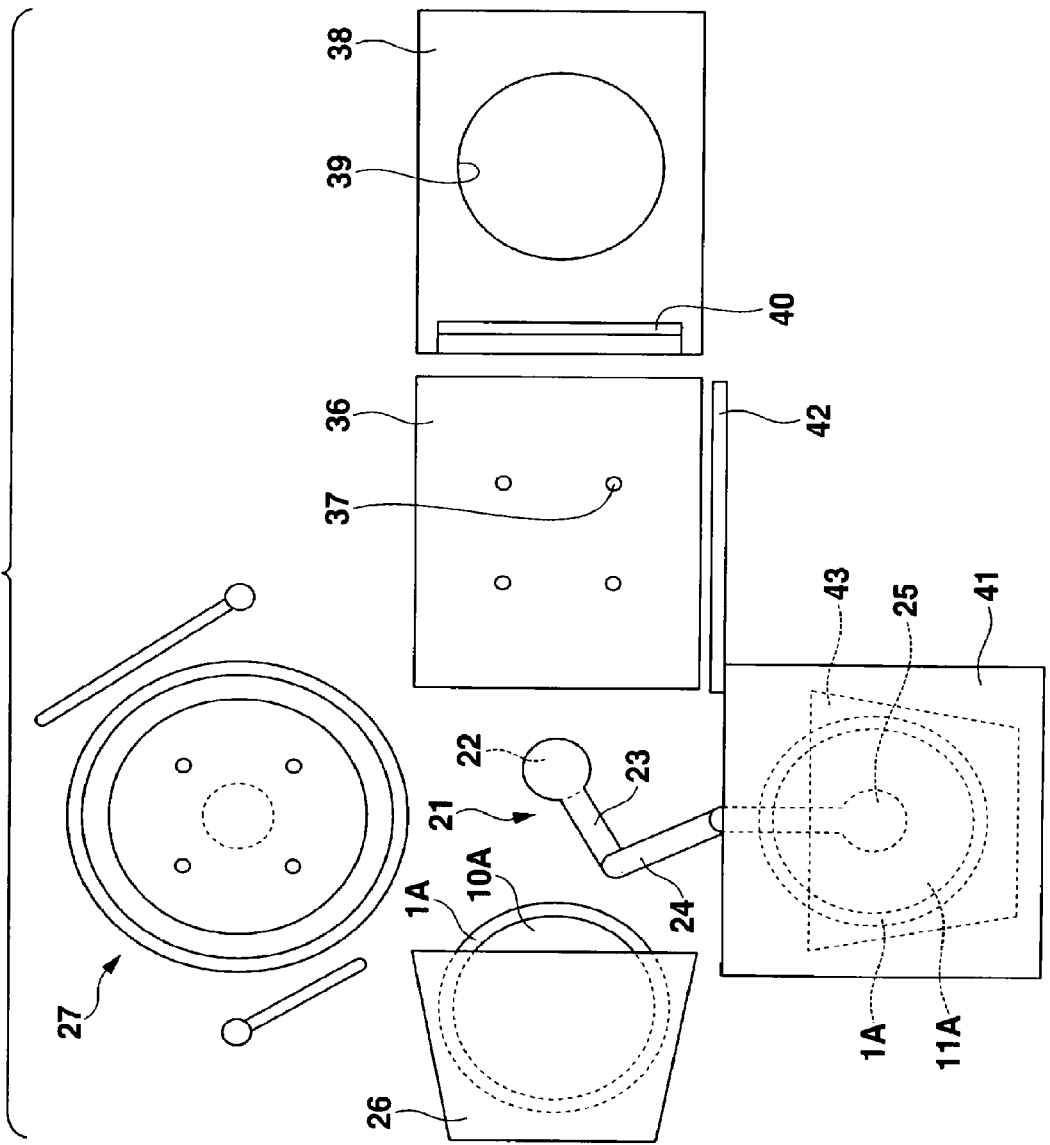
FIG. 34 is a schematic plan view for a step following FIG. 33.

Next, as shown in FIG. 34, the support shaft 22 and the first to third arms 23 to 25 of the wafer transferring means 21 are properly moved such that the distal end of the third arm 25 moves into the vacuum deaerating case 41 and further into a predetermined place within the deaerating wafer cassette 43, and the wafer 1A vacuum-sucked onto the upper surface of the distal end of the third arm 25 is placed at the top in the deaerating wafer cassette 43. Then, the vacuum suction of the wafer 1A onto the upper surface of the distal end of the third arm 25 is cancelled.

Figure 35:
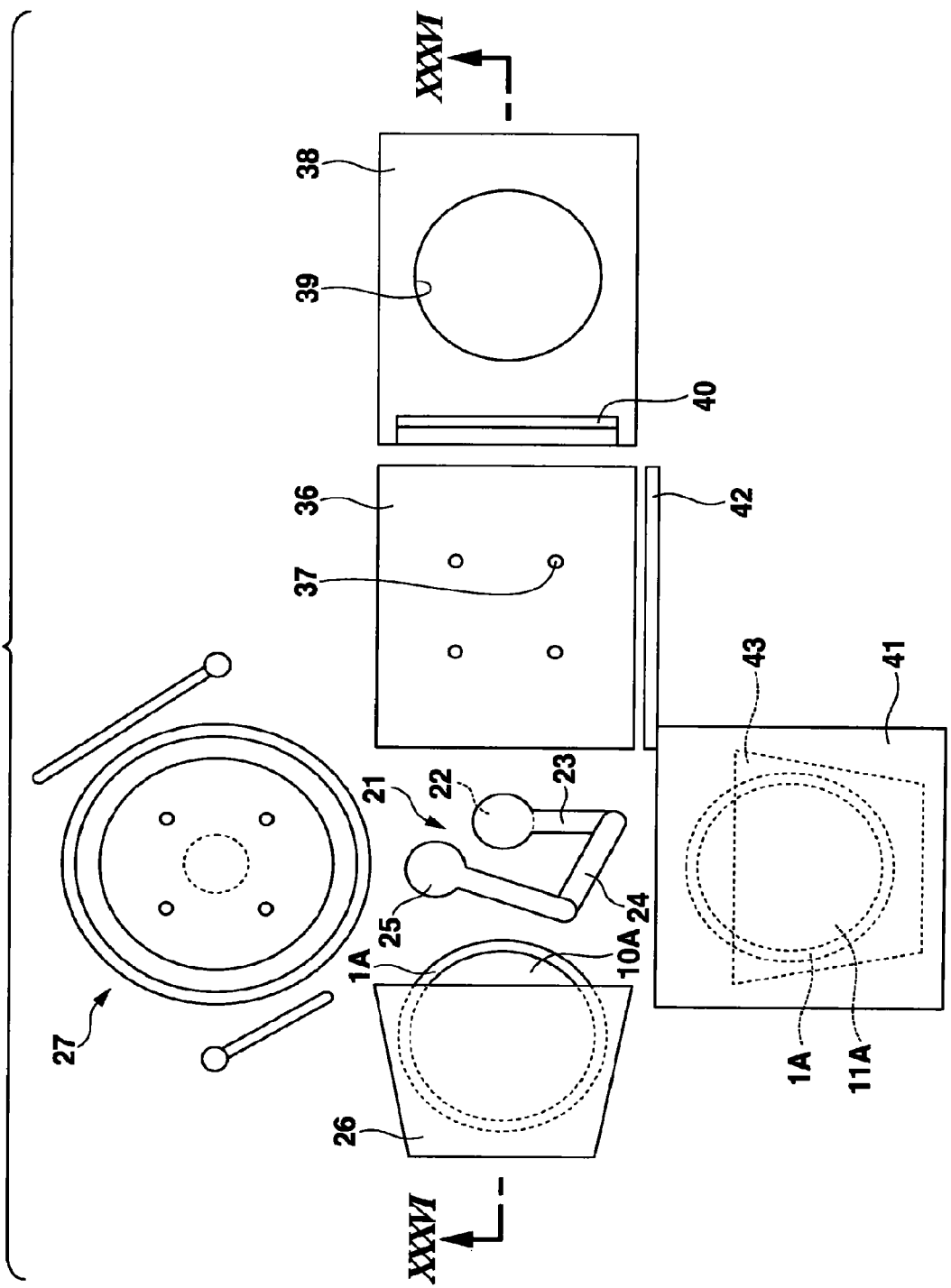
FIG. 35 is a schematic plan view for a step following FIG. 34.
Figure 36:
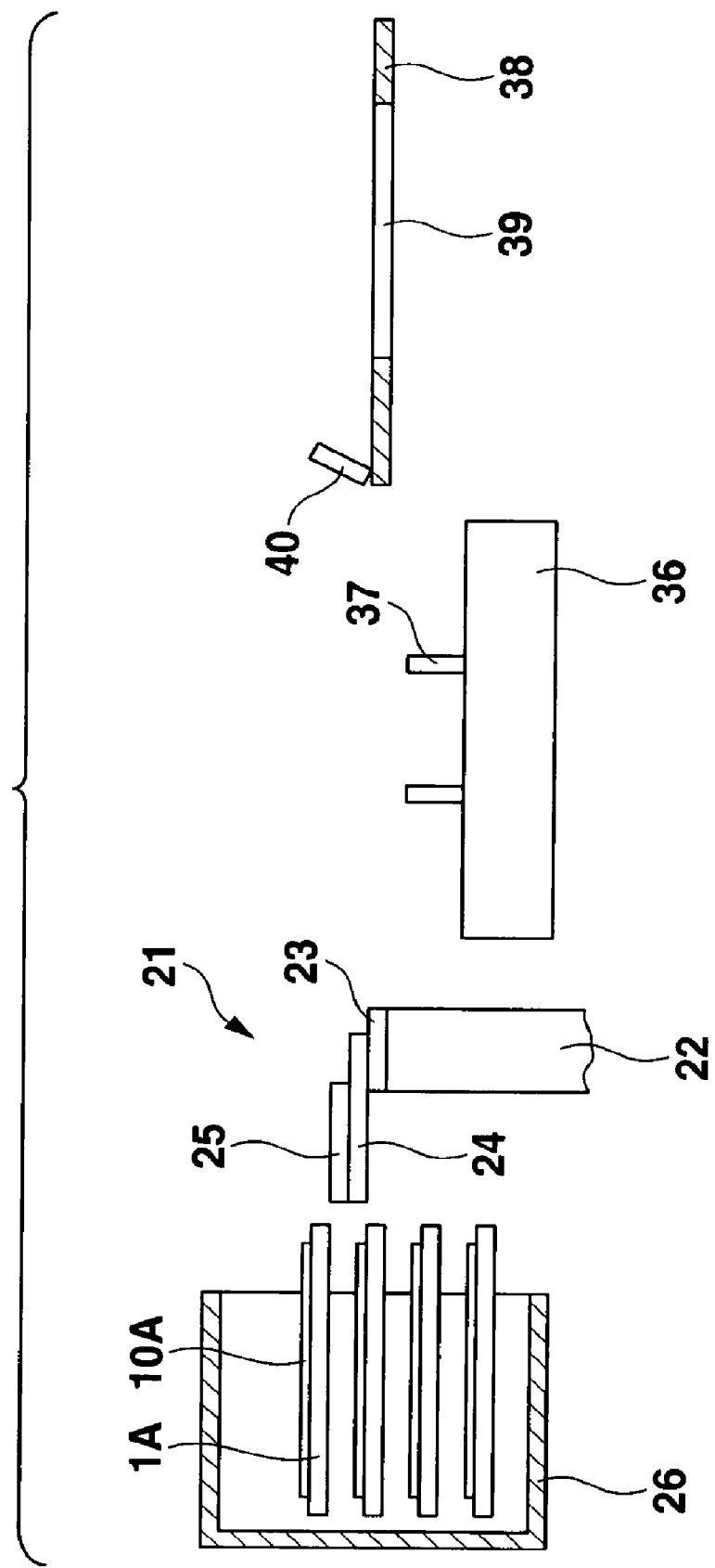
FIG. 36 is a schematic sectional view substantially along the XXXVI-XXXVI line in FIG. 35.

Next, as shown in FIGS. 35 and 36, the support shaft 22 and the first to third arms 23 to 25 of the wafer transferring means 21 are properly moved and located at the initial positions shown in FIG. 8 in a planar view. In this case, the third arm 25 is located at a position at which it can move onto the lower side of the wafer 1A placed at the second position from the top in the wafer cassette 26.

Furthermore, the operation as described above is repeated, such that the wafer 1A placed at the second position from the top in the wafer cassette 26 is taken out, and the second formation film 11A is formed on the first formation film 10A on this wafer 1A taken out, and then this wafer 1A is placed at the second position from the top in the deaerating wafer cassette 43. Subsequently, similar operations are repeated, such that the wafers 1A placed at the third and subsequent positions from the top in the wafer cassette 26 are sequentially taken out, and the second formation films 11A are formed on the first formation films 10A on these wafers 1A taken out, and then these wafers 1A are sequentially placed at the third and subsequent positions from the top in the deaerating wafer cassette 43.

Then, the door 42 is closed, and the vacuum deaerating case 41 is sealed. Further, the vacuum pump (not shown) is driven to form a vacuum in the vacuum deaerating case 41, thereby removing at a time air bubbles scattered within the second formation films 11A on the plurality of wafers 1A placed in the deaerating wafer cassette 43. Then, the vacuum pump is stopped, and the air is brought back into the vacuum deaerating case 41.

Here, the time for forming the second formation film 11A by the screen printing is about 60 seconds at most, but the sum of exhaust time by the vacuum pump and the time for bringing the air back into the vacuum deaerating case 41 is relatively long and about 3 to 20 minutes, so that deaerating the plurality of wafers 1A at a time can reduce the whole processing time.

Then, the door 42 is opened. Further, the support shaft 22 and the first to third arms 23 to 25 of the wafer transferring means 21 are properly moved to sequentially take out the plurality of wafers 1A placed in the deaerating wafer cassette 43, and these wafers 1A taken out are returned to the original positions in the wafer cassette 26. Then, the wafer cassette 26 is transferred to a thermal treatment unit (not shown) where the first and second formation films 10A and 11A on the plurality of wafers 1A placed in the deaerating wafer cassette 43 are hardened at a time by a thermal treatment to form the first and second sealing films 10 and 11 (see FIG. 4).

When the second formation film 11A alone is formed without forming the first formation film 10A in contrast to what has been described above, the amount of air caught as air bubbles into the second formation film 11A is large because the surface forming the second formation film 11A is an uneven surface formed by the upper surface of the protective film 5 including the wiring lines 8. Thus, when the air bubbles which have reached and come out of the surface of the second formation film 11A expand and vanish, a large number of bubble traces which are crater-shaped depressions formed on the surface of the second formation film 11A are produced and may remain on the surface of the second sealing film 11 even after the subsequent polishing step shown in FIG. 5, which leads to, for example, the decrease of strength.

On the contrary, when the first formation film 10A is formed and the second formation film 11A is formed on this first formation film 10A, the amount of air caught as air bubbles into the second formation film 11A is small because the upper surface of the first formation film 10A is flat. Thus, when the air bubbles which have reached and come out of the surface of the second formation film 11A expand and vanish, the production of bubble traces which are crater-shaped depressions formed on the surface of the second formation film 11A is reduced. After the subsequent polishing step shown in FIG. 5, the rate of bubble traces remaining on the surface of the second sealing film 11 can be decreased.

In the embodiment described above, a resin supply spray nozzle capable of scanning in XY directions may be used instead of the resin drop nozzle arm 32. In this case, the resin supply spray nozzle scans in the XY directions with the wafer 1A in a fixed state to apply the liquid resin, so that the edge rinse nozzle arm 34 can also be omitted if a portion of the peripheral part on the wafer 1A for use in alignment in the subsequent step is covered with a mask. Moreover, the vacuum deaerating case 41 may be composed of a lower case and an upper case, and the upper case may be vertically moved to open/close the vacuum deaerating case 41.

As described above, according to this invention, the first sealing film formation film made of the liquid resin alone is formed to fill the gap between the wiring lines, so that even if the second sealing film formation film is formed by the liquid resin containing the fillers such as the silica particles, air bubbles due to the fillers can be prevented from remaining between the wiring lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   forming a plurality of wiring lines on an upper side of a semiconductor wafer;
   forming a first sealing film formation film made of a liquid resin on an upper side of the semiconductor wafer in an atmosphere to fill a gap between the plurality of wiring lines;
   carrying out vacuum deaeration for the first sealing film formation film;
   forming a second sealing film formation film made of a liquid resin containing fillers on the first sealing film formation film in the atmosphere; and
   carrying out the vacuum deaeration for the second sealing film formation film.

2. The semiconductor device manufacturing method according to claim 1, further comprising forming a plurality of columnar electrodes on connection pads of the wiring lines, respectively.

3. The semiconductor device manufacturing method according to claim 1, further comprising:
   hardening the first and second sealing film formation films by a thermal treatment to form first and second sealing films; and
   cutting the semiconductor wafer and the first and second sealing films to obtain a plurality of semiconductor devices.

4. The semiconductor device manufacturing method according to claim 1, wherein the first sealing film formation film is formed so that the wiring lines are covered and so that an upper surface of the first sealing film formation film is flat.

5. The semiconductor device manufacturing method according to claim 1, wherein the first sealing film formation film is formed by spin coating.

6. The semiconductor device manufacturing method according to claim 1, wherein the second sealing film formation film is formed by screen printing.

7. The semiconductor device manufacturing method according to claim 3, further comprising polishing the second sealing film and upper sides of the columnar electrodes after forming the first and second sealing films.

8. The semiconductor device manufacturing method according to claim 7, further comprising forming a solder ball on each of the columnar electrodes after the polishing.

9. The semiconductor device manufacturing method according to claim 2, wherein the vacuum deaeration for the first sealing film formation film is carried out by simultaneously carrying out the vacuum deaeration for a plurality of semiconductor wafers in each of which the columnar electrodes are formed on the connection pad portions of the wiring lines.

10. The semiconductor device manufacturing method according to claim 9, wherein the vacuum deaeration for the first sealing film formation film is carried out by simultaneously carrying out the vacuum deaeration for the plurality of semiconductor wafers to each of which the first sealing film formation film is provided.

11. The semiconductor device manufacturing method according to claim 1, wherein the vacuum deaeration for the second sealing film formation film is carried out by simultaneously carrying out the vacuum deaeration for a plurality of semiconductor wafers to each of which the second sealing film formation film is provided.

12. The semiconductor device manufacturing method according to claim 1, wherein the first sealing film formation film does not include any fillers.

13. The semiconductor device manufacturing method according to claim 9, wherein the vacuum deaeration for the first sealing film formation film is carried out in a deaerating wafer cassette, and the vacuum deaeration for the second sealing film formation film is carried out in said deaerating wafer cassette.

* * * * *